United States Patent
Xie et al.

(10) Patent No.: US 10,204,994 B2
(45) Date of Patent: Feb. 12, 2019

(54) METHODS OF FORMING A SEMICONDUCTOR DEVICE WITH A GATE CONTACT POSITIONED ABOVE THE ACTIVE REGION

(71) Applicant: GLOBALFOUNDRIES Inc., Grand Cayman (KY)

(72) Inventors: Ruilong Xie, Niskayuna, NY (US); Chanro Park, Clifton Park, NY (US); Andre P. Labonte, Mechanicville, NY (US); Lars W. Liebmann, Halfmoon, NY (US); Nigel G. Cave, Saratoga Springs, NY (US); Mark V. Raymond, Latham, NY (US); Guillaume Bouche, Albany, NY (US); David E. Brown, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 4 days.

(21) Appl. No.: 15/477,565

(22) Filed: Apr. 3, 2017

(65) Prior Publication Data

US 2018/0286956 A1    Oct. 4, 2018

(51) Int. Cl.
| | |
|---|---|
| *H01L 29/417* | (2006.01) |
| *H01L 29/423* | (2006.01) |
| *H01L 29/45* | (2006.01) |
| *H01L 21/768* | (2006.01) |
| *H01L 27/088* | (2006.01) |
| *H01L 29/66* | (2006.01) |
| *H01L 21/8234* | (2006.01) |
| *H01L 21/3213* | (2006.01) |

(52) U.S. Cl.
CPC .. *H01L 29/41775* (2013.01); *H01L 21/32139* (2013.01); *H01L 21/76805* (2013.01); *H01L 21/76895* (2013.01); *H01L 21/823431* (2013.01); *H01L 21/823437* (2013.01); *H01L 21/823475* (2013.01); *H01L 27/0886* (2013.01); *H01L 29/42376* (2013.01); *H01L 29/45* (2013.01); *H01L 29/66545* (2013.01)

(58) Field of Classification Search
CPC .............. H01L 29/41775; H01L 21/32139
See application file for complete search history.

(56) References Cited

U.S. PATENT DOCUMENTS

| | | | |
|---|---|---|---|
| 2012/0199896 A1* | 8/2012 | Noguchi | H01L 27/11519 257/296 |
| 2012/0256238 A1* | 10/2012 | Ning | H01L 21/84 257/280 |
| 2015/0076609 A1* | 3/2015 | Xie | H01L 29/785 257/365 |

* cited by examiner

*Primary Examiner* — Thao X Le
*Assistant Examiner* — Xia Cross
(74) *Attorney, Agent, or Firm* — Amerson Law Firm, PLLC

(57) ABSTRACT

One illustrative device disclosed herein includes, among other things, a stepped conductive source/drain structure with a first recess defined therein and a stepped final gate structure with a second recess defined therein, wherein, when viewed from above, the second recess is axially and laterally offset from the first recess. In this example, the device also includes a layer of insulating material positioned above the stepped conductive source/drain structure and the stepped final gate structure, a conductive gate (CB) contact that is conductively coupled to the stepped final gate structure and a conductive source/drain (CA) contact that is conductively coupled to the stepped conductive source/drain structure.

18 Claims, 23 Drawing Sheets

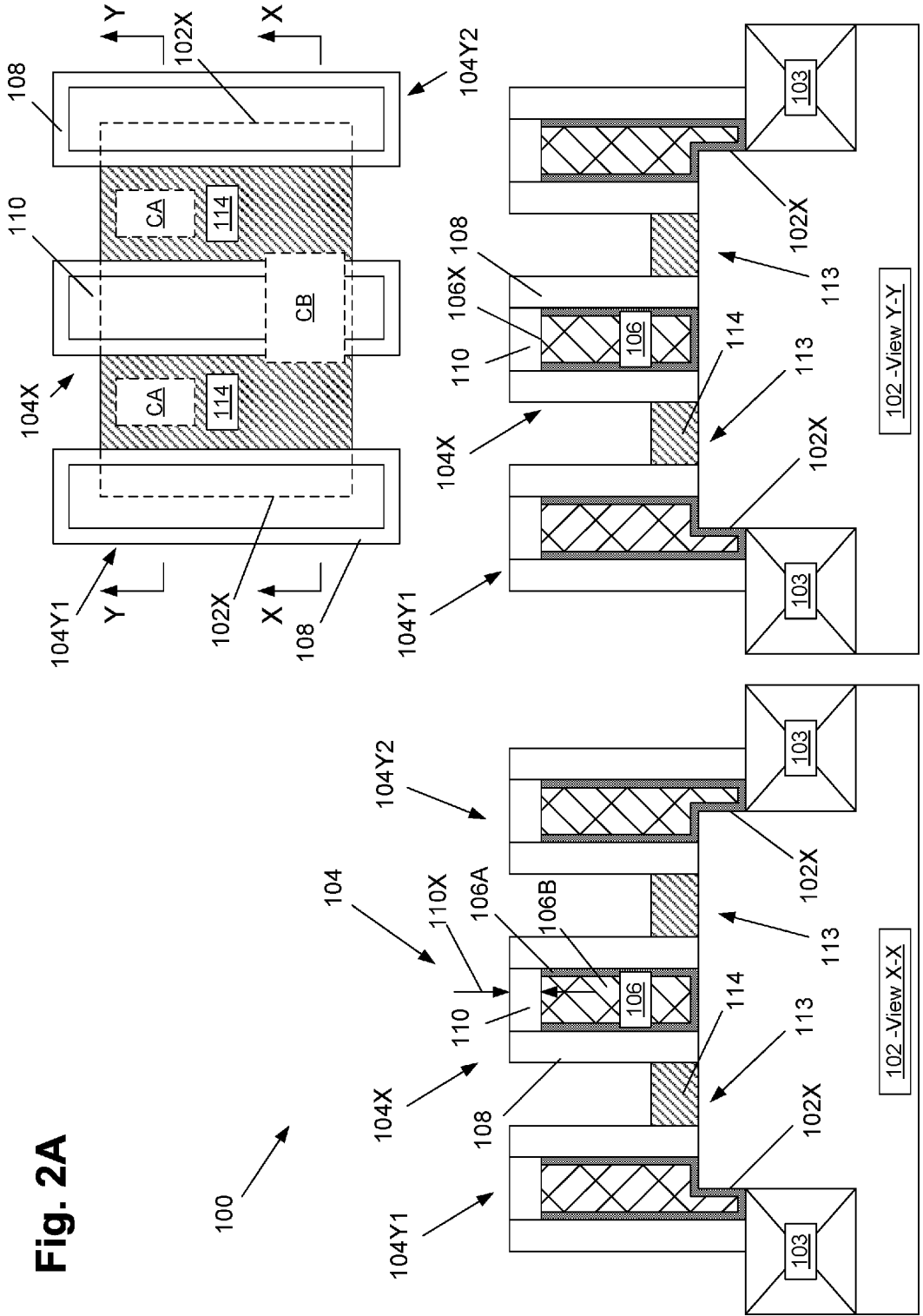

METHODS OF FORMING A SEMICONDUCTOR DEVICE WITH A GATE CONTACT POSITIONED ABOVE THE ACTIVE REGION

BACKGROUND OF THE INVENTION

1. Field of the Invention

The present disclosure generally relates to the fabrication of integrated circuits, and, more particularly, to methods of forming a semiconductor device with a gate contact positioned above the active region.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

In contrast to a planar FET, which, as the name implies, is a generally planar structure, a so-called FinFET device has a three-dimensional (3D) structure. FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate structure 16, a sidewall spacer 18 and a gate cap layer 20. Trenches 22 are formed in the substrate 12 to define the fins 14. A recessed layer of insulating material 17 is positioned under the gate structure 16 and between the fins 14 in the areas outside of the gate structure, i.e., in the source/drain regions of the device 10. The gate structure 16 is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device 10. The fins 14 have a three-dimensional configuration: a height H, a width W and an axial length L. The axial length L corresponds to the direction of current travel in the device 10 when it is operational. The portions of the fins 14 covered by the gate structure 16 are the channel regions of the FinFET device 10. The gate structures 16 for such FinFET devices 10 may be manufactured using so-called "gate-first" or "replacement gate" (gate-last) manufacturing techniques. A FinFET device may have either a tri-gate or dual-gate channel region. For a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior FET structure as compared to that of a planar FET, especially in the 20 nm CMOS technology node and beyond.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. Generally, the conductive lines provide the intra-level electrical connections, while the conductive vias provide the inter-level connections or vertical connections between different levels. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques.

FIG. 1B is a cross-sectional view of an illustrative integrated circuit product 10A comprised of a plurality of transistor devices 15 formed in and above a semiconductor substrate 12A. A schematically depicted isolation region 13 has also been formed in the substrate 12A. In the depicted example, the transistor devices 15 are comprised of an illustrative gate structure, i.e., a gate insulation layer 15A and a gate electrode 15B, a gate cap layer 21, a sidewall spacer 23 and simplistically depicted source/drain regions 25. At the point of fabrication depicted in FIG. 1B, layers of insulating material 17A, 17B, i.e., interlayer dielectric materials, have been formed above the product 10A. Other layers of material, such as contact etch stop layers and the like, are not depicted in the attached drawings. Also depicted are illustrative raised epi source drain regions 25X and source/drain contact structures 27 which include a combination of a so-called "trench silicide" (TS) structure 29 and a so-called "CA contact" structure 31. Also depicted is a gate contact structure 33 which is sometimes referred to as a "CB contact" structure. The CB contact 33 is formed so as to contact a portion of the gate electrode 15B of one of the transistors 15. In a plan view, the CB gate contact 33 is positioned vertically above the isolation region 13 that surrounds the product 10A, i.e., the CB gate contact 33 is not positioned above the active region defined in the substrate 12A. The CA contact structures 31 may be in the form of discrete contact elements, i.e., one or more individual contact plugs having a generally square-like or cylindrical shape, that are formed in an interlayer dielectric material, as shown in FIG. 1B. In other applications (not shown in FIG.

1B), the CA contact structures 31 may also be a line-type feature that contacts underlying line-type features, e.g., the TS structure 29 that contacts the source/drain region 25, 25X and typically extends across the entire active region on the source/drain region 25. Also depicted in FIG. 1B is the first metallization layer—the so-called M1 layer—of the multi-level metallization system for the product 10A that is formed in a layer of insulating material 35, e.g., a low-k insulating material. A plurality of conductive vias—so-called V0 vias 37—are provided to establish electrical connection between the device-level contacts—CA contacts 31 and the CB contact 33—and the M1 layer. The M1 layer typically includes a plurality of metal lines 39 that are routed as needed across the product 10A.

In one embodiment, the process flow of forming the TS structures 29, CA contacts 31 and CB contacts 33 may be as follows. After the first layer of insulating material 17A is deposited, TS openings are formed in the first layer of insulating material 17A that expose portions of underlying source/drain regions 25, 25X. Thereafter, traditional silicide is formed through the TS openings, followed by forming tungsten (not separately shown) on the metal silicide regions, and performing a chemical mechanical polishing (CMP) process down to the top of the gate cap layer 21. Then, the second layer of insulating material 17B is deposited and contact openings for the CA contacts 31 are formed in the second layer of insulating material 17B that expose portions of the underlying tungsten metallization above the source/drain regions 25. Next, while the opening for the CA contacts 31 is masked, the opening for the CB contact 33 is formed in the second layer of insulating material 17B and through the gate cap layer 21 so as to expose a portion of the gate electrode 15B. Typically, the CB contact 33 is in the form of a round or square plug. Thereafter, the conductive CA contacts 31 and the conductive CB contact 33 are formed in their corresponding openings in the second layer of insulating material 17B by performing one or more common metal deposition and CMP process operations, using the second layer of insulating material 17B as a polish-stop layer to remove excess material positioned outside of the contact openings. The CA contacts 31 and CB contact 33 typically contain a uniform body of metal, e.g., tungsten, and may also include one or more metallic barrier layers (not shown) positioned between the uniform body of metal and the layer of insulating material 17B. The source/drain contact structures 27 (TS contacts 29, CA contacts 31) and the CB contact 33 are all considered to be device-level contacts within the industry.

FIG. 1C is a simplistic plan view of an illustrative FinFET device comprised of three illustrative fins 41. Also depicted are illustrative CA contacts 31, a CB contact 33, a gate cap layer 21, sidewall spacers 23 and the trench silicide structures 29 formed above the source/drain regions 25. As noted above, the CB gate contact 33 is positioned vertically above the isolation region 13 that surrounds the product 10A, i.e., the CB gate contact 33 is not positioned above the active region defined in the substrate 12A. The CB gate contact 33 is positioned above the isolation region 13 so as to avoid or reduce the chances of creating an electrical short between the CB contact 33 and the TS structure 29, i.e., there is a minimum spacing 43 that must be maintained between these two structures according to various design rules in an attempt to prevent such electrical shorts. Unfortunately, there is an area penalty associated with the requirement that the CB contact 33 only be positioned above the isolation region 13. The problem is the same for transistor configurations other than FinFET devices as well, e.g., planar FET devices. What is needed is a method for forming the CB gate contact 33 above the active region of the device so as to conserve valuable plot space on an integrated circuit product.

The present disclosure is directed to various methods of forming a gate contact above an active region of a semiconductor device and the resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a gate contact above an active region of a semiconductor device and the resulting device wherein the gate contact is positioned above the active region. One illustrative method disclosed includes, among other things, forming a gate comprising a final gate structure and a gate cap positioned above the final gate structure, forming a conductive source/drain structure adjacent the gate and forming an etch mask that (1) covers a first portion of the conductive source/drain structure above a first area of the active region and exposes a second portion of the conductive source/drain structure above a second area of the active region and (2) covers a first portion of the gate cap above the first area of the active region and exposes a second portion of the gate cap above the second area of the active region. In this example, the method also includes, with the etch mask in position, removing the second portion of the gate cap from above a first portion of the final gate structure while leaving the first portion of the gate cap in position above a second portion of the final gate structure and performing a recess etching process on the first portion of the final gate structure to thereby define a stepped final gate structure with a first recess defined therein, the first recess being located vertically above the second area of the active region. The method also includes forming a replacement gate cap in the first recess, removing the etch mask and, after removing the etch mask, performing a recess etching process on the second portion of the conductive source/drain structure to thereby define a stepped conductive source/drain structure with a second recess defined therein, the second recess being located vertically above the first area of the active region, wherein, when viewed from above, the first recess is axially and laterally offset from the second recess.

One illustrative device disclosed herein includes, among other things, a stepped conductive source/drain structure with a first recess defined therein and a stepped final gate structure with a second recess defined therein, wherein, when viewed from above, the second recess is axially and laterally offset from the first recess. In this example, the device also includes a layer of insulating material positioned above the stepped conductive source/drain structure and the stepped final gate structure, a conductive gate (CB) contact that is conductively coupled to the stepped final gate structure and a conductive source/drain (CA) contact that is conductively coupled to the stepped conductive source/drain structure.

BRIEF DESCRIPTION OF THE DRAWINGS

The disclosure may be understood by reference to the following description taken in conjunction with the accompanying drawings, in which like reference numerals identify like elements, and in which:

FIGS. 2A-2L depict various methods disclosed herein for forming a gate contact above an active region of a semiconductor device.

Figure 1A:
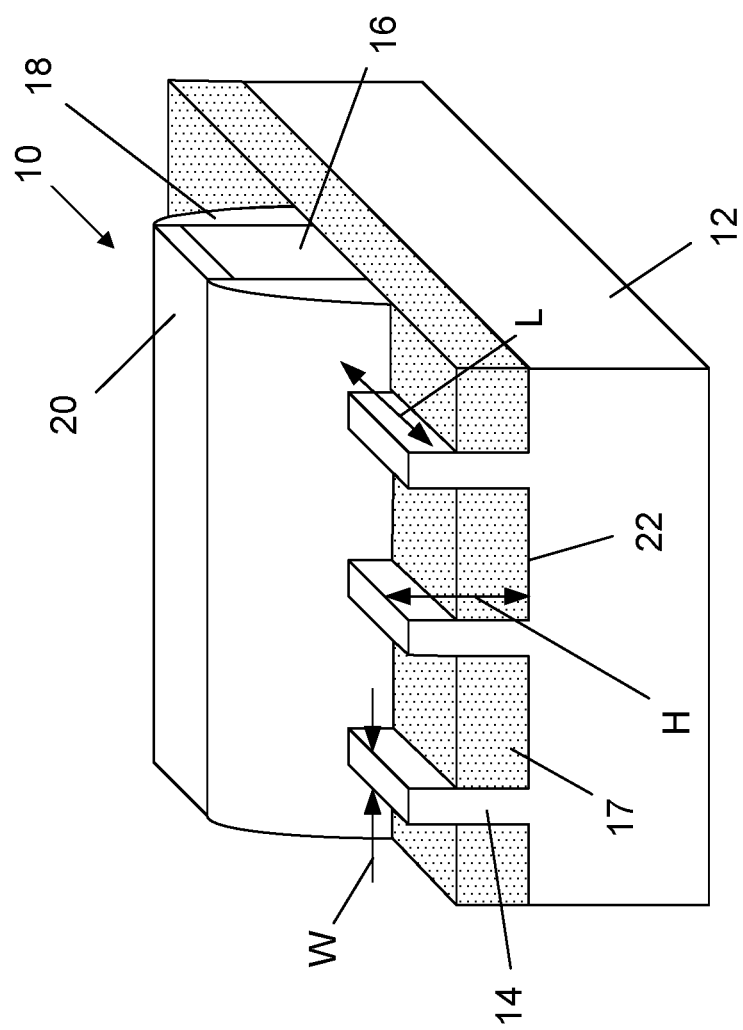
FIG. 1A is a simplistic depiction of an illustrative prior art FinFET device.
Figure 1B:
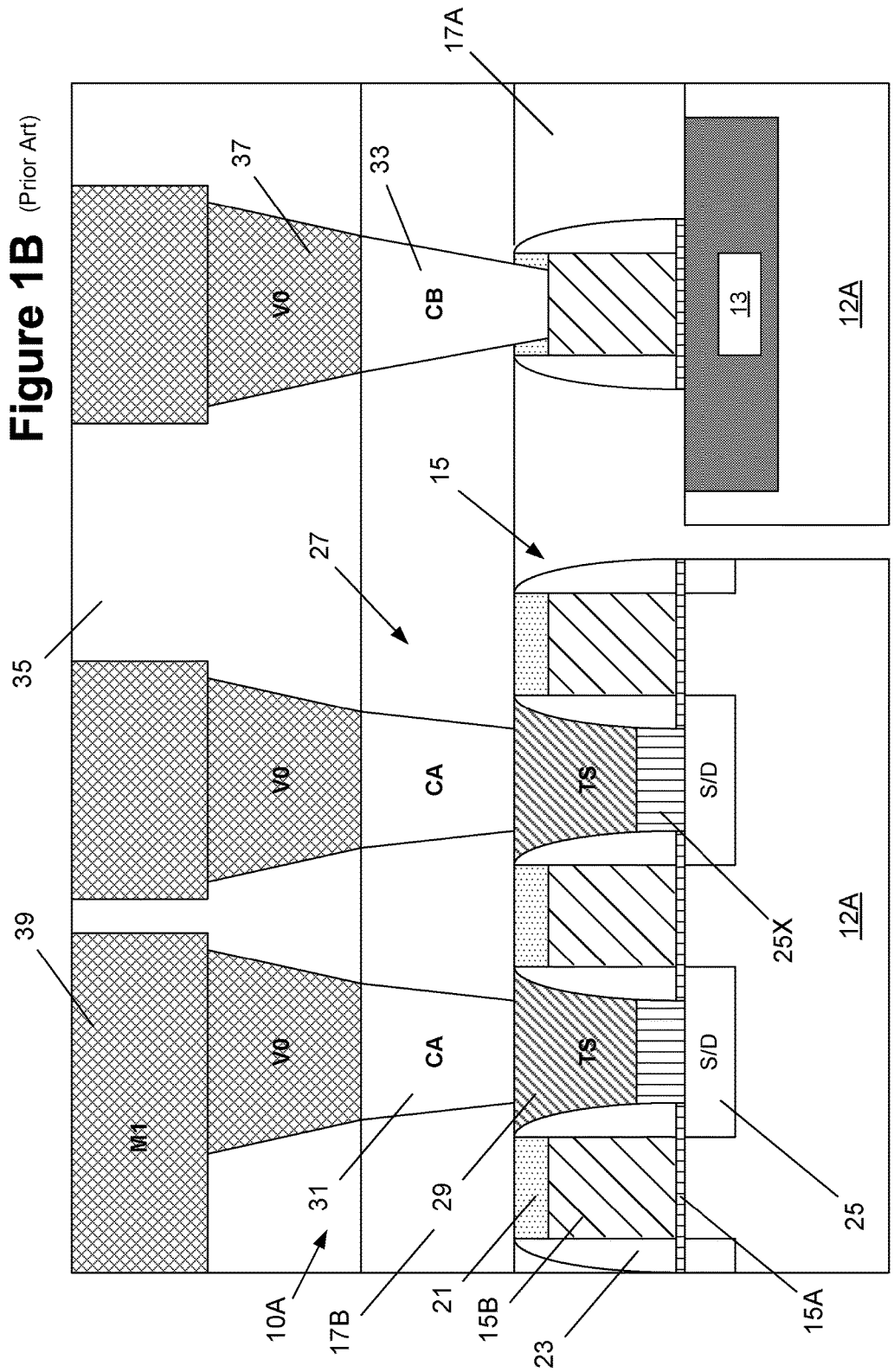
FIGS. 1B-1C depict various illustrative prior art arrangements of device-level contacts and metallization layers for an integrated circuit product.
Figure 1C:
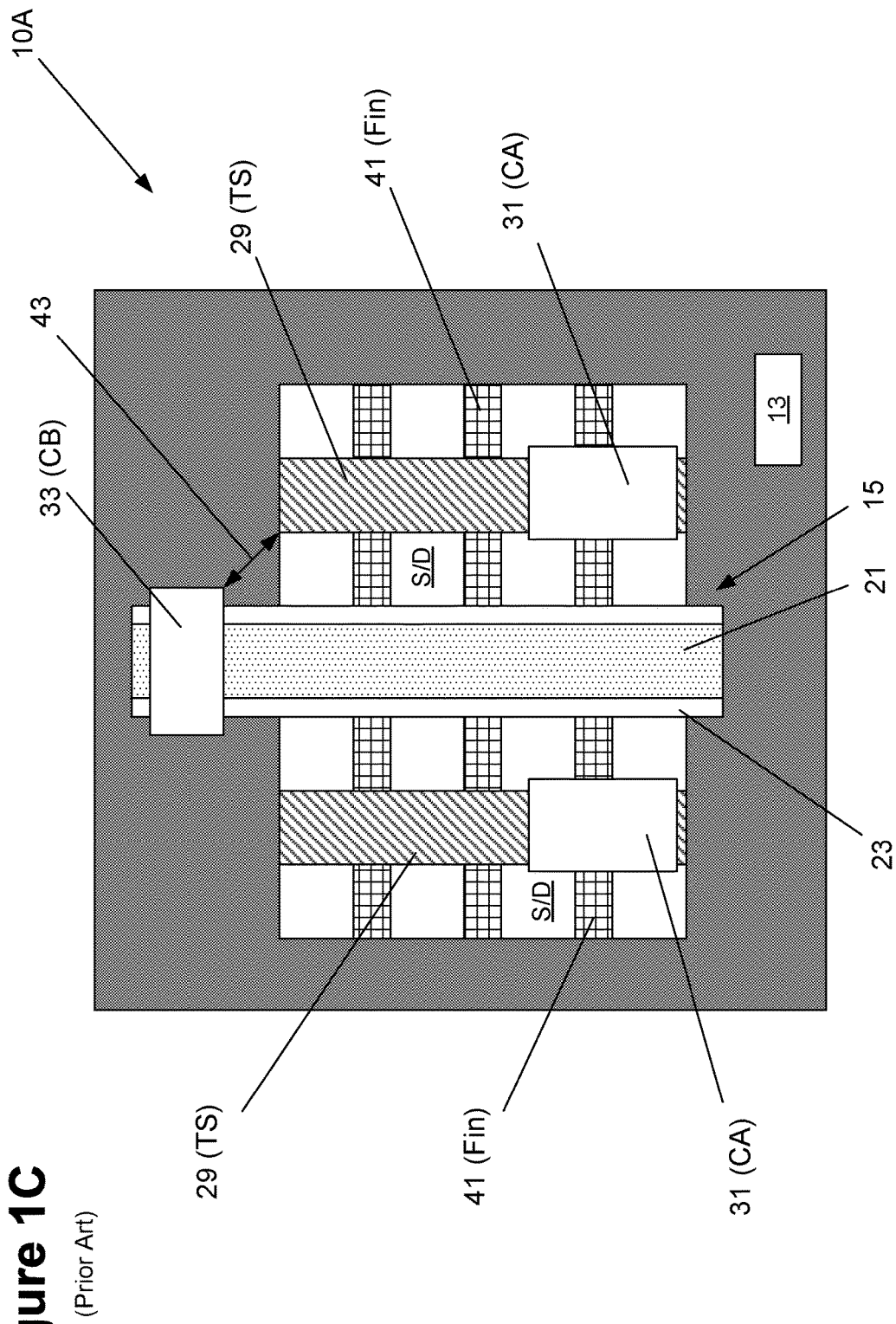

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a gate contact above an active region of a semiconductor device and the resulting device, wherein the gate contact is positioned above the active region. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2B:
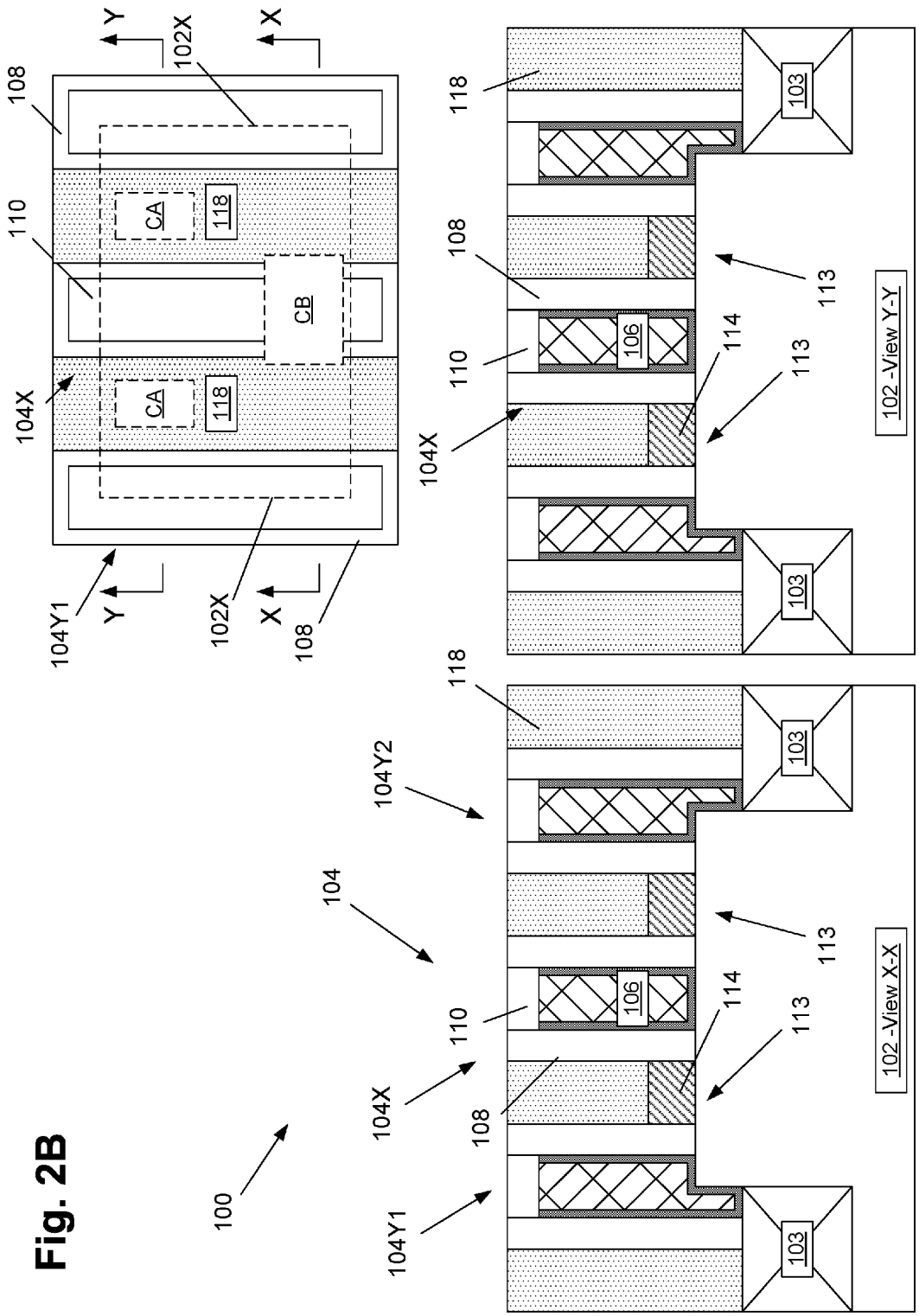

FIGS. 2A-2L depict various illustrative methods disclosed herein for forming a gate contact above an active region of a semiconductor device. FIG. 2A contains a simplistic plan view showing where various cross-sectional views are taken in the drawings. The plan view also depicts where illustrative source/drain contacts ("CA") and a gate contact ("CB") will eventually be formed for the product 100. As indicated in FIG. 2A, the view X-X is a cross-sectional view taken through the device (in a direction corresponding to the gate length (current transport) direction of the device) at a location where the gate contact ("CB") will eventually be formed. The view Y-Y is a cross-sectional view taken through the device (in a direction corresponding to the gate length direction of the device) at a location where the source/drain contacts ("CA") will eventually be formed. It should also be noted that, although some of the figures contain a plan view of the device, not all aspects of the processing shown in the cross-sectional views will be depicted in the plan view so as to not overly complicate the drawings.

With continuing reference to FIG. 2A, the illustrative product 100 will be formed in and above the semiconductor substrate 102. The product 100 may comprise either NMOS transistors, PMOS transistors or both types of transistors. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration (not shown) that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate"

should be understood to cover all semiconducting materials and all forms of such materials.

As noted above, the subject matter disclosed herein may be employed where the gate structures for the illustrative transistor devices may be formed using well-known "gate first" or "replacement gate" manufacturing techniques. In the example depicted herein, the novel methods and devices will be described in the context where a replacement gate manufacturing technique was performed to form the gate structures for the product 100, i.e., a sacrificial gate structure (not shown) was removed and replaced with a final gate structure). Accordingly, FIG. 2A depicts the product 100 at a point in fabrication wherein several process operations have been performed. First, an isolation region 103 was formed in the substrate 102 so as to define an active region (102X) where a transistor device will be formed. Next, a plurality of illustrative gates 104 was formed above the substrate 102. Each of the gates 104 includes a schematically depicted final gate structure 106 (made in this example by performing a replacement gate technique), a sidewall spacer 108 and an initial gate cap 110 that covers the entire axial length of the final gate structures 106. At this point in the process flow, the initial gate cap 110 has a substantially uniform thickness 110X. The gate 104X is the active gate structure for the transistor device, while the gates 104Y1 and 104Y2 are "dummy" gate structures as it relates to the operation of the transistor device. The sidewall spacer 108 and the gate cap layer 110 are typically comprised of silicon nitride. The gates 104 may be formed using well-known processing techniques. The illustrative final gate structures 106 comprises a high-k (k value greater than 10) gate insulation layer 106A, such as hafnium oxide (or other high-k materials), and a schematically depicted conductive gate electrode 106B. In practice, the conductive gate electrode 106B may be comprised of a plurality of conductive (e.g., metal-containing) layers of material. The final gate structures 106 have an initial upper surface 106X that defines the overall height of the gate structures 106 which is substantially uniform for the entire axial length of the final gate structures 106. After the gates 104 were formed, an epi semiconductor material 114 was formed in the source/drain regions 113 of the transistor devices. The epi semiconductor material 114 need not be formed in all applications. The physical size of the gates 104 and the gate pitch for the gate structures may vary depending upon the particular application.

FIG. 2B depicts the product 100 after an illustrative layer of insulating material 118, e.g., silicon dioxide, was blanket-deposited above the product 100 and after a chemical mechanical planarization (CMP) process was performed to planarize its upper surface, followed by gate open process to remove the dummy gate if that is a replacement gate flow, followed by HKMG formation, recess, and SAC cap formation.

Figure 2C:
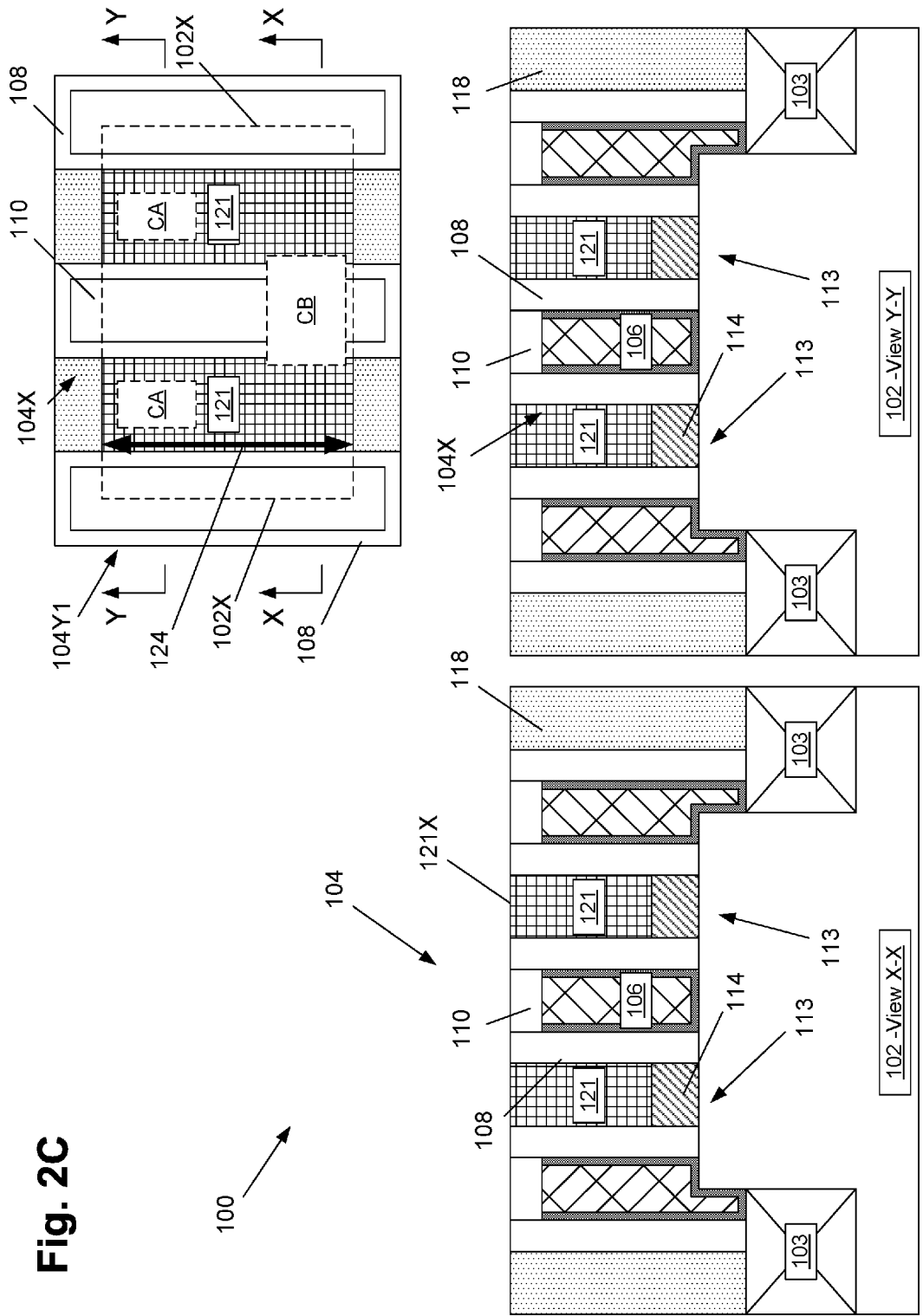

FIG. 2C depicts the product 100 after several processing operations were performed. First, the layer of insulating material 118 was patterned to define openings that expose portions of underlying source/drain regions 113 (and the epi material 114 if present). Thereafter, traditional conductive silicide material was formed through the openings in the layer of insulating material 118. Then, another conductive material, such as tungsten (not separately shown) was formed on the metal silicide regions. Lastly, a CMP process that stops on the gate caps 110 was performed to remove excess conducive materials. This results in the formation of conductive source/drain contact structures 121 having an upper surface 121X.

Figure 2D:
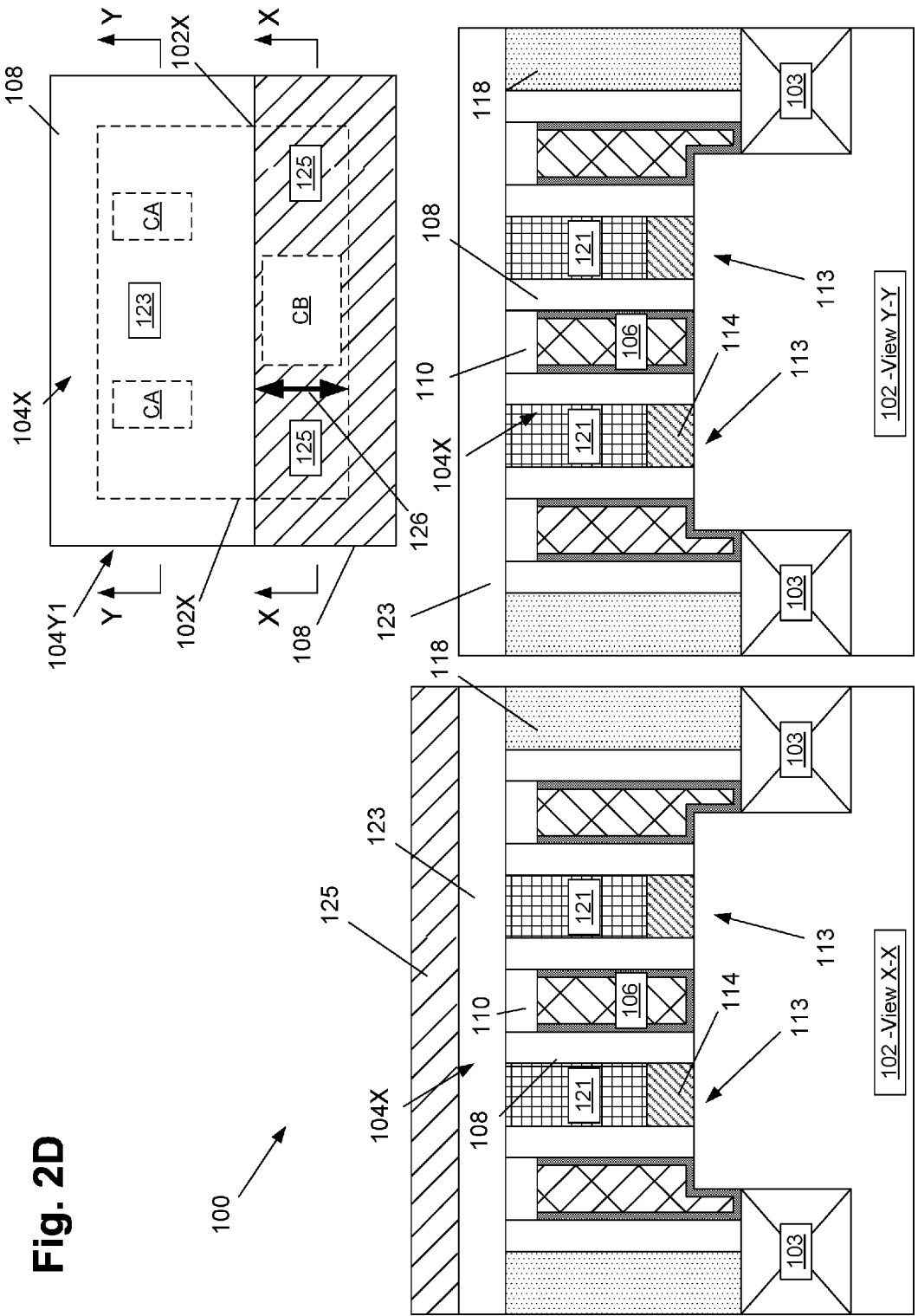

FIG. 2D depicts the product 100 after several processing operations were performed. First, a hard-mask layer 123, e.g., silicon dioxide, SiCO, etc., was blanket-deposited above the product 100. Then, a patterned masking layer 125, e.g., OPL, was formed above the product 100. The patterned masking layer 125 covers the area above the active region 102X where the gate contact (CB) will be formed but exposes the area above the active region 102X where the S/D contacts (CA) will be formed.

Figure 2E:
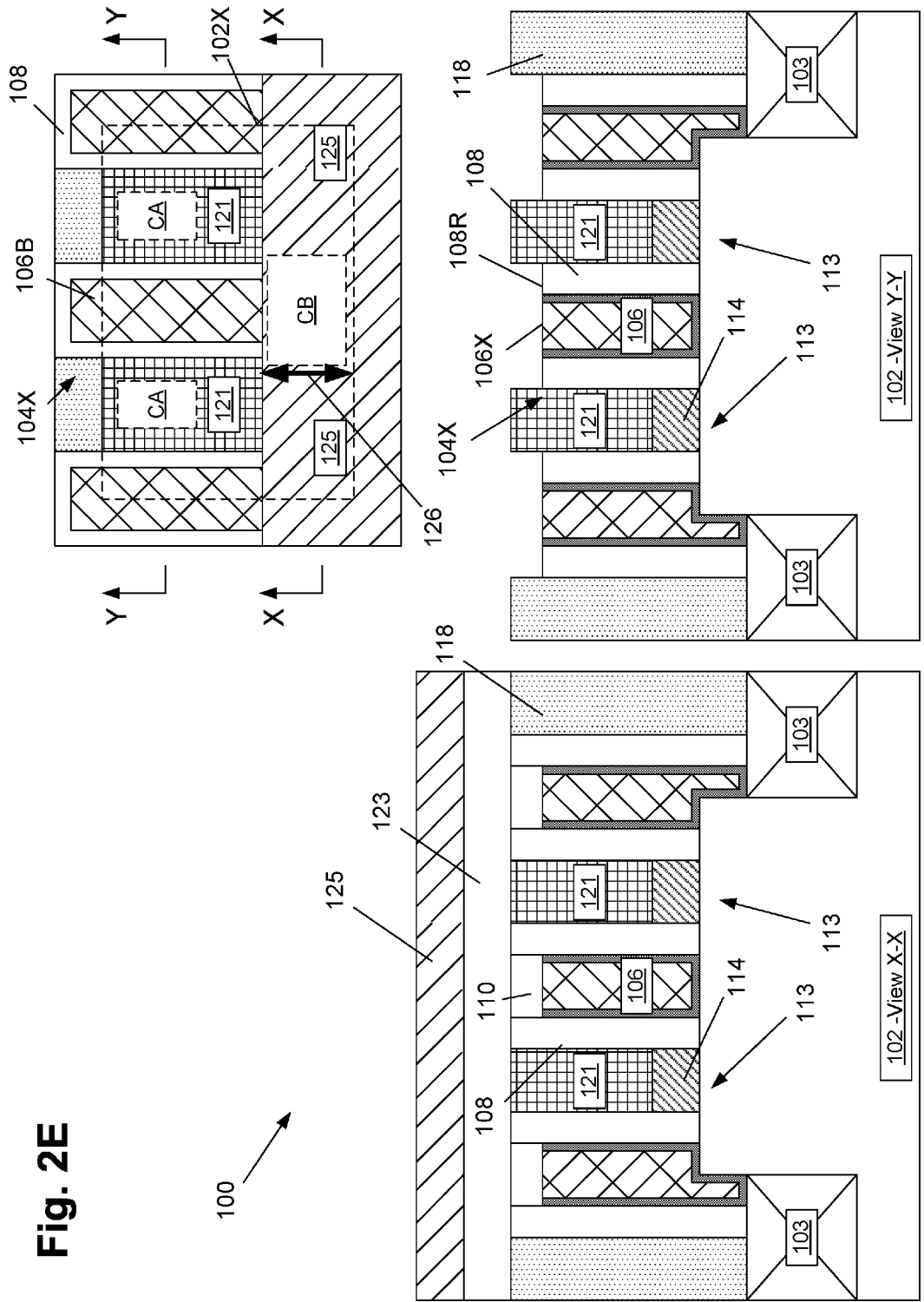

FIG. 2E depicts the product 100 after several processing operations were performed. An etching process was performed thorough the patterned masking layer 125 so as to remove the portion of the hard-mask layer 123 positioned above the active region 102X where the S/D contacts (CA) will be formed. The patterned etch mask 123 (1) covers a first portion of the conductive source/drain structures 121 above a first area of the active region and exposes a second portion of the conductive source/drain structures 121 above a second area of the active region and (2) covers a first portion of the gate cap 110 above the first area of the active region and exposes a second portion of the gate cap 110 above the second area of the active region. In one embodiment, the etching process that is performed to pattern the etch mask 123 also removes the exposed portions of the gate caps 110 and recesses the exposed portions of the sidewall spacers 108 selectively relative to the conductive source/drain contact structures 121 such that the spacers 108 have a recessed upper surface 108R. This process operation results in the exposure of the upper surface 106X of the final gate structures 106 in the area above the active region 102X where the S/D contacts (CA) will be formed. No attempt has been made to show the gate insulation layer 106A in the plan view. Each of the gate structures 106 has an overall axial length 124 (see the plan view in FIG. 2C). In one embodiment, the covered axial length 126 (see the plan view in FIG. 2E) of the gate structure 106 covered by the hard mask 123 may be approximately 20-60% of the axial length 124 of the gate structures 106.

Figure 2F:
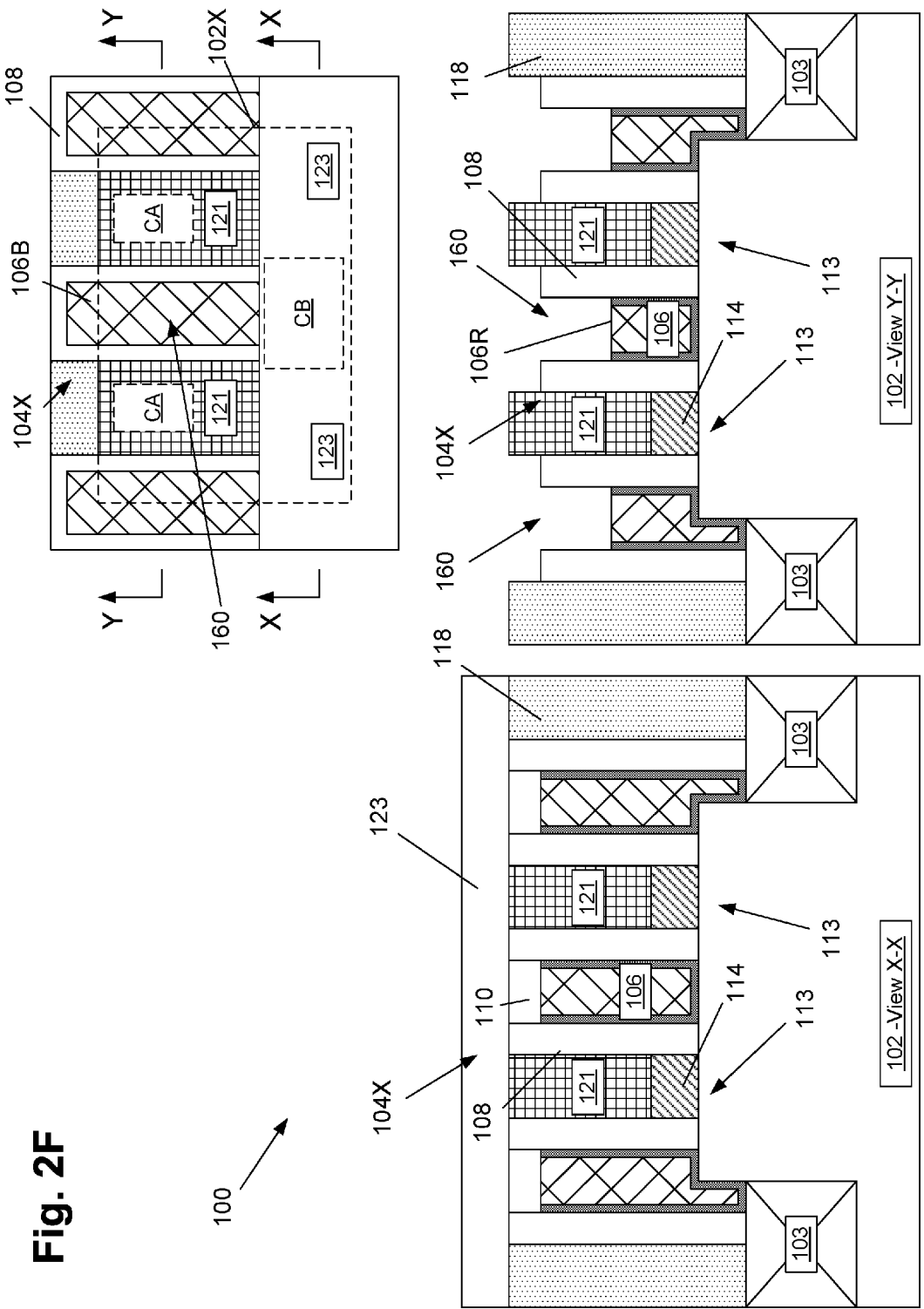

FIG. 2F depicts the product 100 after several processing operations were performed. First, the patterned masking layer 125 was removed. Thereafter, one or more timed, recess etching processes were performed to reduce the overall height or thickness of the exposed portions of the final gate structures 106. In some cases, this etching process may be a substantially anisotropic etching process with some lateral etching involved, while, in other cases, it may be an anisotropic etching process that involves very little, if any, lateral etching. It should be noted that materials of the final gate structures 106 (e.g., TiN, TiC, W, etc.) are different than the material of the conductive source/drain contact structures 121 (e.g., Co, Ru, etc.) thereby allowing the selection of a proper etching process to allow for selective removal of the materials of the final gate structures 106 relative to the conductive source/drain contact structures 121. If there is an application where the material of the final gate structure 106 and the conductive source/drain contact structures 121 is the same, a thin capping layer (not shown) may be formed above the conductive source/drain contact structures 121 prior to performing this gate-recess etching step to prevent the conductive source/drain contact structures 121 from being recessed during this gate-recess etching process (as described more fully below in connection with the process flow shown in FIGS. 3A-3H). After the etching process, the exposed portions of the final gate structures 106 have a recessed upper surface 106R that is positioned at a level that is below a level of the upper surface 106X of the final gate structures 106, e.g., by a distance of about 5-30 nm. This results in the formation of a plurality of gate recesses 160 above the recessed materials of the final gate structures 106. Note that the portions of the final gate structures 106 positioned under the hard mask layer 123 still have their original overall height.

Figure 2G:
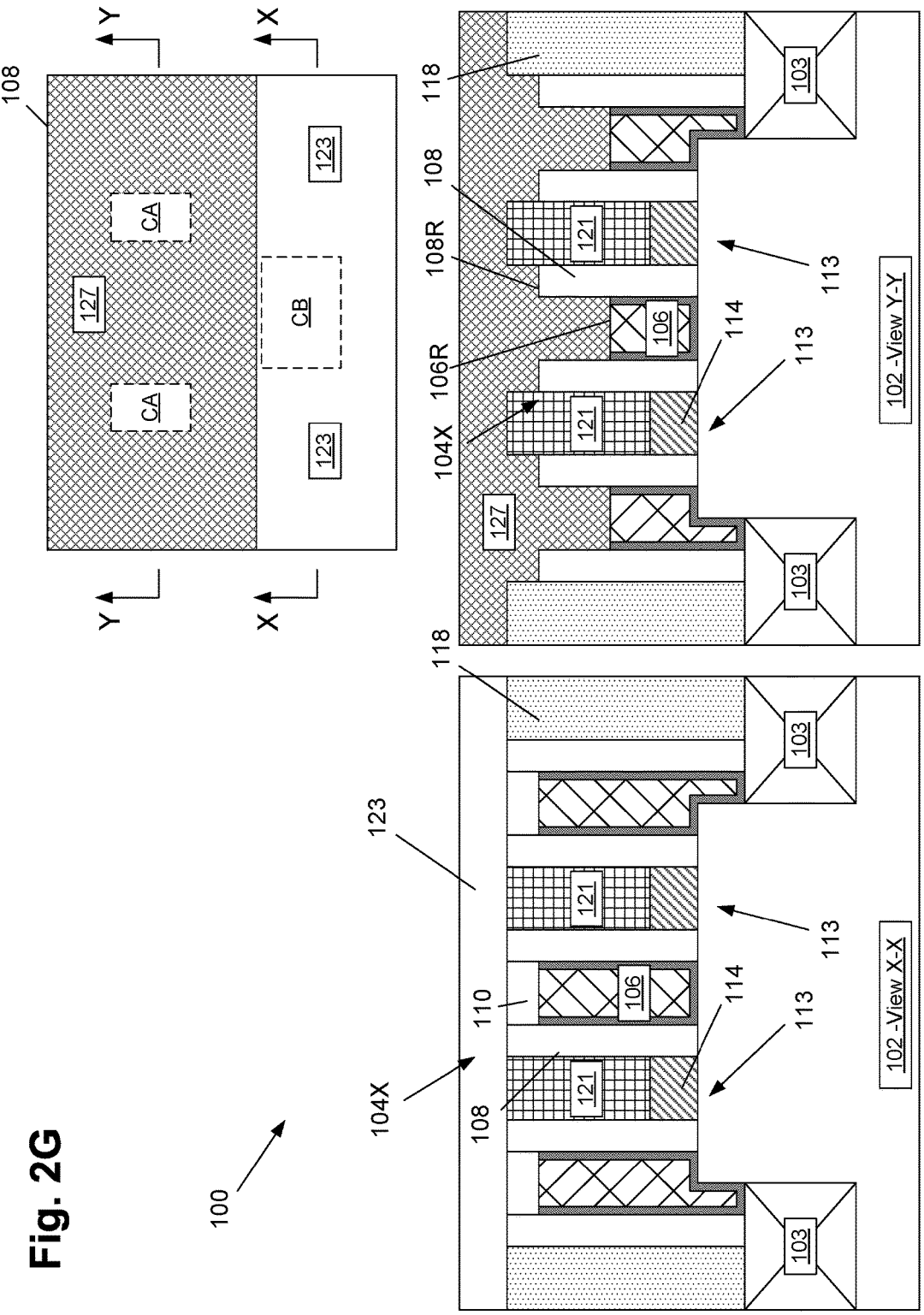

FIG. 2G depicts the product 100 after several processing operations were performed. First, a layer of gate cap material 127 was blanket-deposited on the product 100 in the gate recesses 160 and above the hard-mask layer 123. The layer of gate cap material 127 overfills the gate recesses 160. Thereafter, a chemical mechanical planarization (CMP) process was performed to planarize the upper surface of the layers 127, 123. The layer of gate cap material 127 may be comprised of a variety of materials, e.g., silicon nitride, etc., and it may be formed of the same material as that of the gate caps 110 and the spacers 108. Importantly, the gate cap material 127 should be made of a material that will permit the hard mask layer 123 to be selectively removed relative to the gate cap material 127.

Figure 2H:
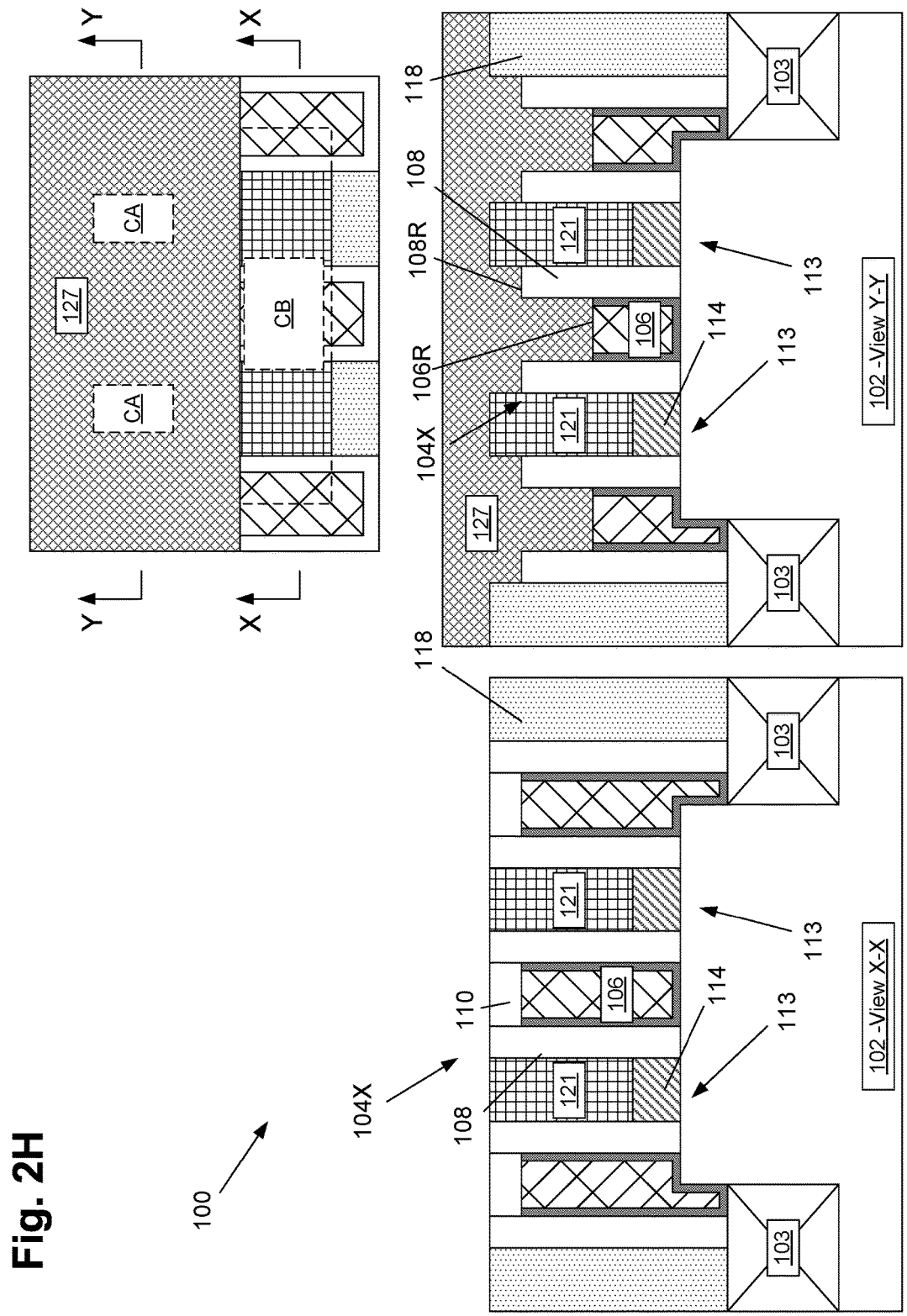

FIG. 2H depicts the product 100 after an etching process was performed to selectively remove the hard mask layer 123 selectively relative to the surrounding materials, and particularly the gate cap material layer 127. After this etching process, the remaining portions of the original gate caps 110, the spacers 108 and the conductive source/drain contact structures 121 positioned in the area above the active region 102X where the gate contact (CB) will be formed are exposed.

Figure 2I:
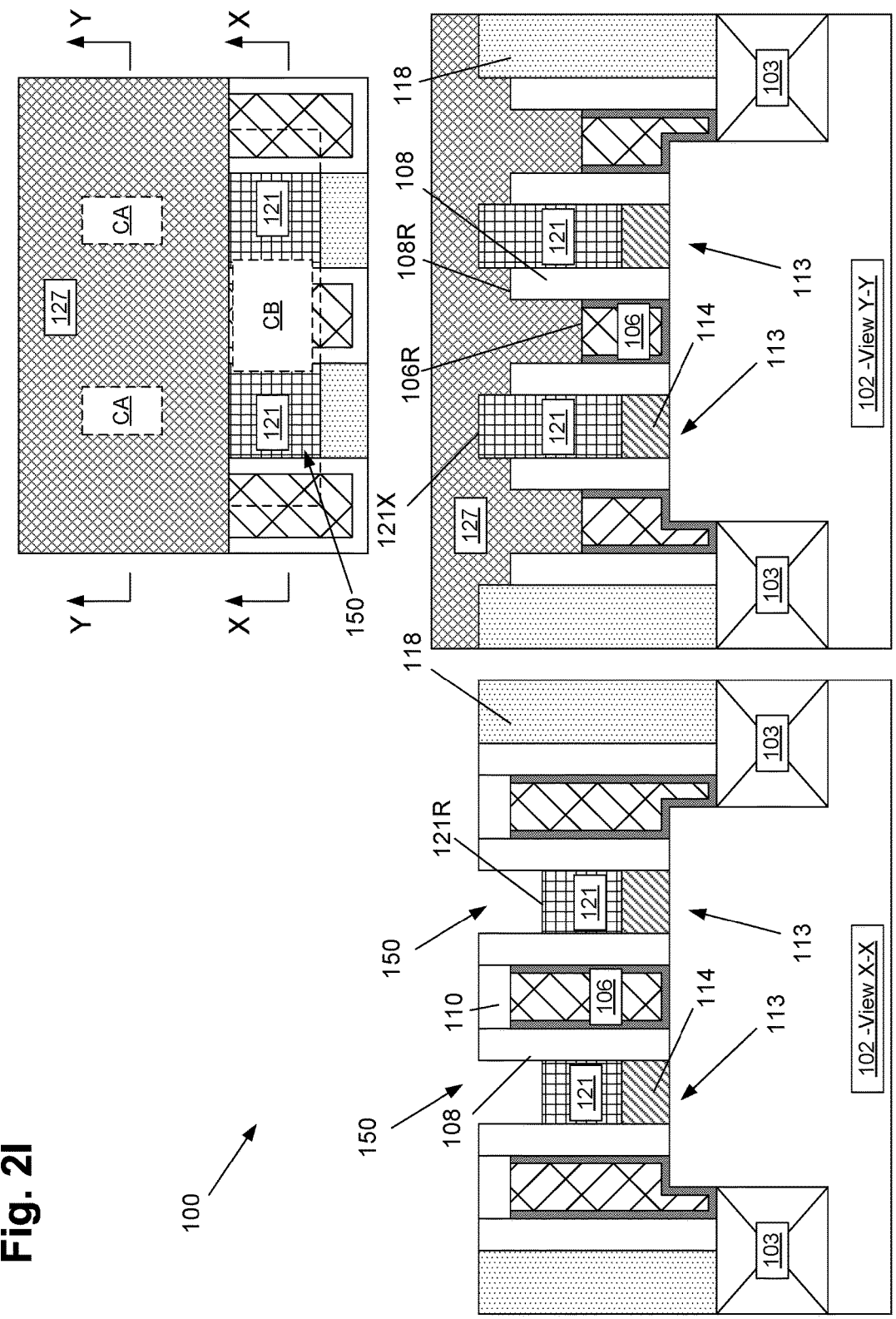

FIG. 2I depicts the product 100 after one or more timed, recess etching processes were performed to reduce the overall height or thickness of the exposed portions of the conductive source/drain contact structures 121 in the area above the active region 102X where the gate contact (CB) will be formed. After the etching process, the exposed portions of the conductive source/drain contact structures 121 have a recessed upper surface 121R that is positioned at a level that is below a level of the upper surface 121X of the initial conductive source/drain contact structures 121, e.g., by a distance of about 10-40 nm. This results in the formation of a plurality of recesses 150 in the conductive source/drain contact structures 121 in the area above the active region 102X where the gate contact (CB) will be formed.

Figure 2J:
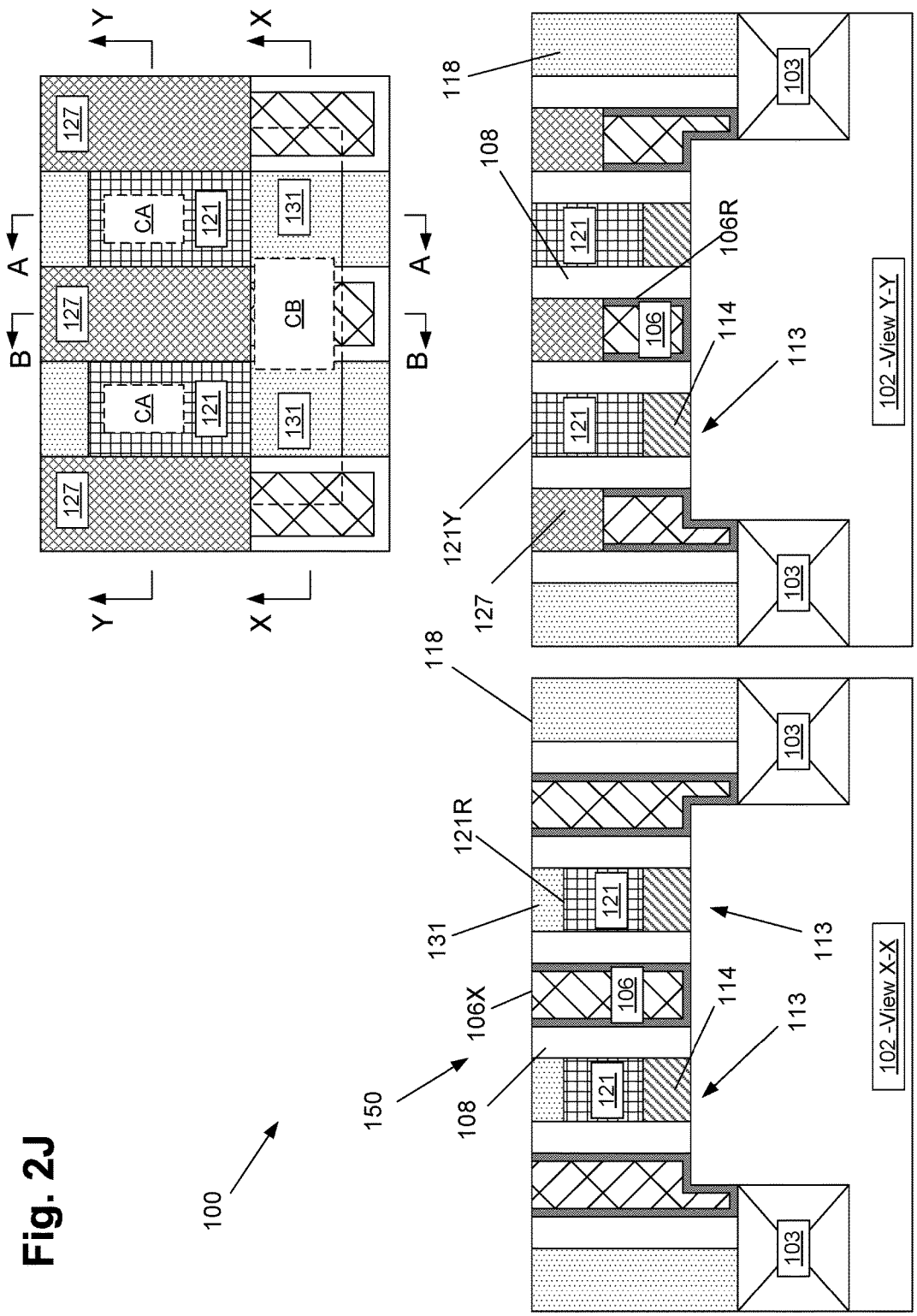

FIG. 2J depicts the product 100 after several processing operations were performed. First, a layer of insulating material 131 was blanket-deposited on the product 100 in the recesses 150 above the recessed conductive source/drain contact structures 121. Thereafter, a chemical mechanical planarization (CMP) process was performed to remove the remaining portions of the original gate caps 110. The CMP process also reduces some of the original height of the portions of the conductive source/drain contact structures 121 that are not covered by the material 131 such that they now have a recessed upper surface 121Y that is approximately the same level as the surface 106X of the original final gate structures 106. Note that materials of the final gate structures 106 were recessed by an amount that is greater than the initial thickness 110X of the gate caps 110. As a result, the original gate caps 110 can be removed while the recessed gate materials remained covered by the gate cap material 127 positioned in the recesses 160. The layer of material 131 may be comprised of a variety of materials, e.g., silicon dioxide, etc., and it may be formed of the same material as that of the layer of insulating material 118.

Figure 2K:
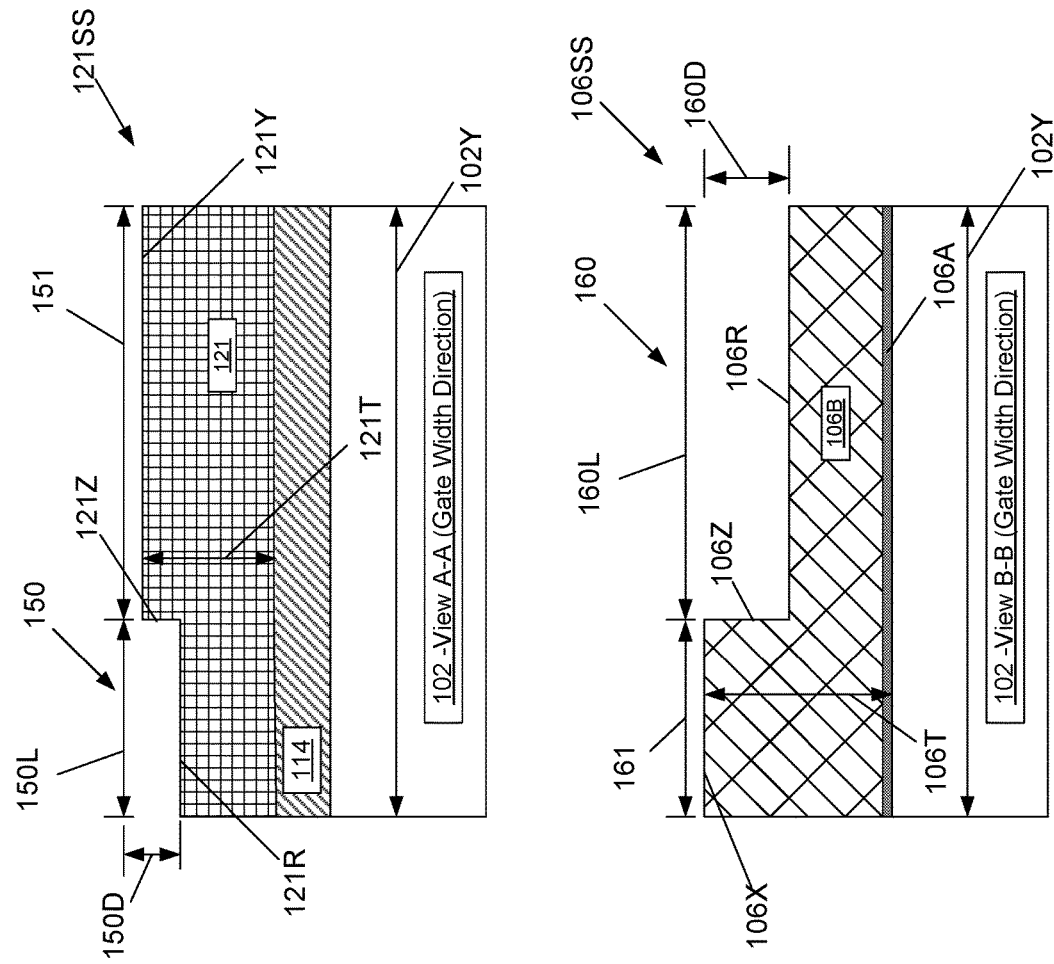
Figure 2L:
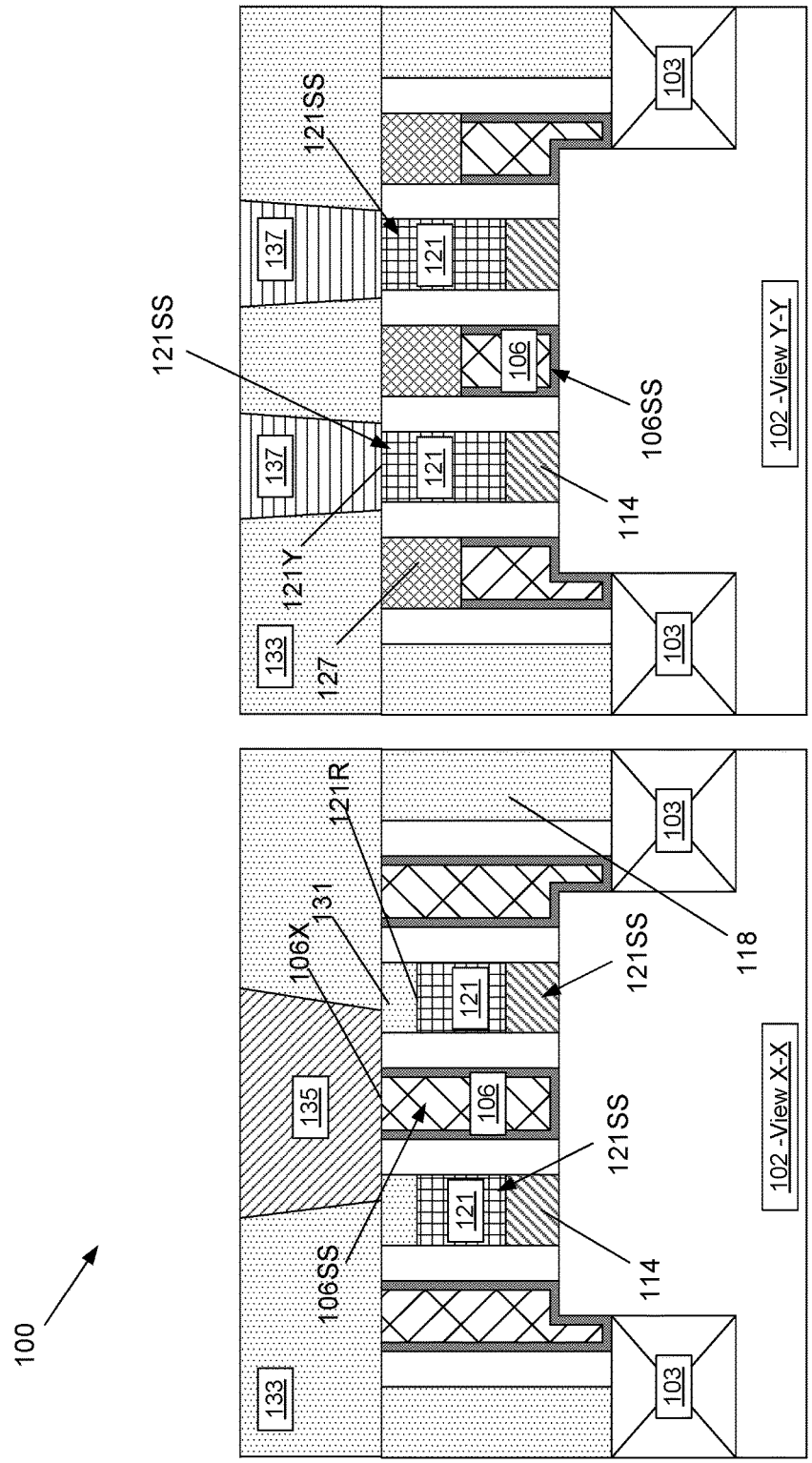

FIG. 2K contains cross-sectional views A-A and B-B taken where indicated in the plan view shown in FIG. 2L. The view A-A is a cross-sectional view of one embodiment of a stepped conductive source/drain structure 121SS that is formed herein. The stepped conductive source/drain structure 121SS has a recessed portion 150 and a non-recessed portion 151. As shown in FIG. 2J, the recess 150 is filled with the insulating material 131. The recess 150 is defined, at least in part, by the recessed surface 121R and a substantially vertical wall 121Z. The depth 150D and axial length 150L (in the gate width direction) of the recessed portion 150 may vary depending upon the particular application. In one illustrative example, the depth 150D may be about 15-70% of the overall thickness 121T of the conductive source/drain contact structures 121 having the upper surface 121Y. The axial length 150L may be about 20-60% of the dimension 102Y of the active region 102X in the gate width direction of the device. In general, the axial length 150L should be as small as possible while still permitting formation of the gate contact (CB) to avoid reducing the mass of the stepped conductive source/drain structure 121SS and thereby increase its electrical resistance.

With continued reference to FIG. 2K, the view B-B is a cross-sectional view of one embodiment of a stepped final gate structure 106SS that is formed herein. The stepped final gate structure 106SS has a recessed portion 160 and a non-recessed portion 161 where the gate contact CB will be formed. As shown in FIG. 2J, the recess 160 is filled with the gate cap material 127 and the insulating material 131. The recess 160 is defined, at least in part, by the recessed surface 106R and a substantially vertical wall 106Z. The depth 160D and axial length 160L (in the gate width direction) of the recessed portion 160 may vary depending upon the particular application. In one illustrative example, the depth 160D may be about 15-70% of the overall thickness 106T of the stepped final gate structure 106SS having the upper surface 106X. The axial length 160L may be about 40-80% of the dimension 102Y of the active region 102X in the gate width direction of the device. In general, the axial length 160L should be sized such that there is still an adequate process margin when forming the gate contact (CB) while considering potential misalignment (in the gate width direction) when forming the gate contact.

Also note that, when viewed from above, the recess 150 in each of stepped conductive source/drain structure 121SS is positioned laterally adjacent the non-recessed portion 161 of the stepped final gate structure 106SS (with an intervening portion of the spacer 108 positioned therebetween). That is, each of the recesses 150 are located on opposite sides of the stepped final gate structure 106SS and they are laterally adjacent the upper surface 106X of the stepped final gate structure 106SS where a gate contact (CB) will be formed.

Similarly, when viewed from above, the recess 160 in the stepped final gate structure 106SS is positioned laterally adjacent the non-recessed portion 151 of each of the stepped conductive source/drain structure 121SS (with an intervening portion of the spacer 108 positioned therebetween). That is, the recess 160 in the final gate structure 106SS is located between and laterally adjacent to the spaces 150 in the stepped conductive source/drain structures 121SS. Moreover, the recess 160 is positioned laterally adjacent the upper surface 121Y of the stepped conductive source/drain structures 121SS where the S/D contacts (CA) will be formed. Also note that, when viewed from above, the recesses 150 in the stepped conductive source/drain structures 121SS are axially and laterally offset from the recess 160 in the stepped final gate structure 106SS.

FIG. 2L depicts the product 100 after a gate contact (CB) structure 135 and a plurality of source/drain contact (CA) structures 137 were formed in a layer of insulating material 133 using traditional manufacturing techniques. The gate contact (CB) structure 135 is conductively coupled to the upper surface 106X of the stepped final gate structure 106SS. Each of the source/drain contact (CA) structures 137 are conductively coupled to the upper surface 121Y of the stepped conductive source/drain structure 121SS. The contact structures 135, 137 may be of any desired cross-sectional configuration when viewed from above, e.g., square, rectangular, round, etc. The contact structures 135, 137 are intended to be schematic and representative in nature, as they may be formed using any of a variety of different conductive materials and by performing traditional manufacturing operations. The contact structures 135, 137 may also contain one or more barrier layers (not depicted). In one illustrative example, the contact structures 135, 137 may be formed by depositing a liner, e.g., Ti, TiN, followed by overfilling the contact openings with a conductive material, such as tungsten or cobalt. Thereafter, a CMP process may be performed to planarize the upper surface of the layer of insulating material 133, which results in the removal of excess portions of the liner and the tungsten (or cobalt) positioned above the layer of insulating material 133 outside of the contact openings and the formation of the contact structures 135, 137.

Figure 3A:
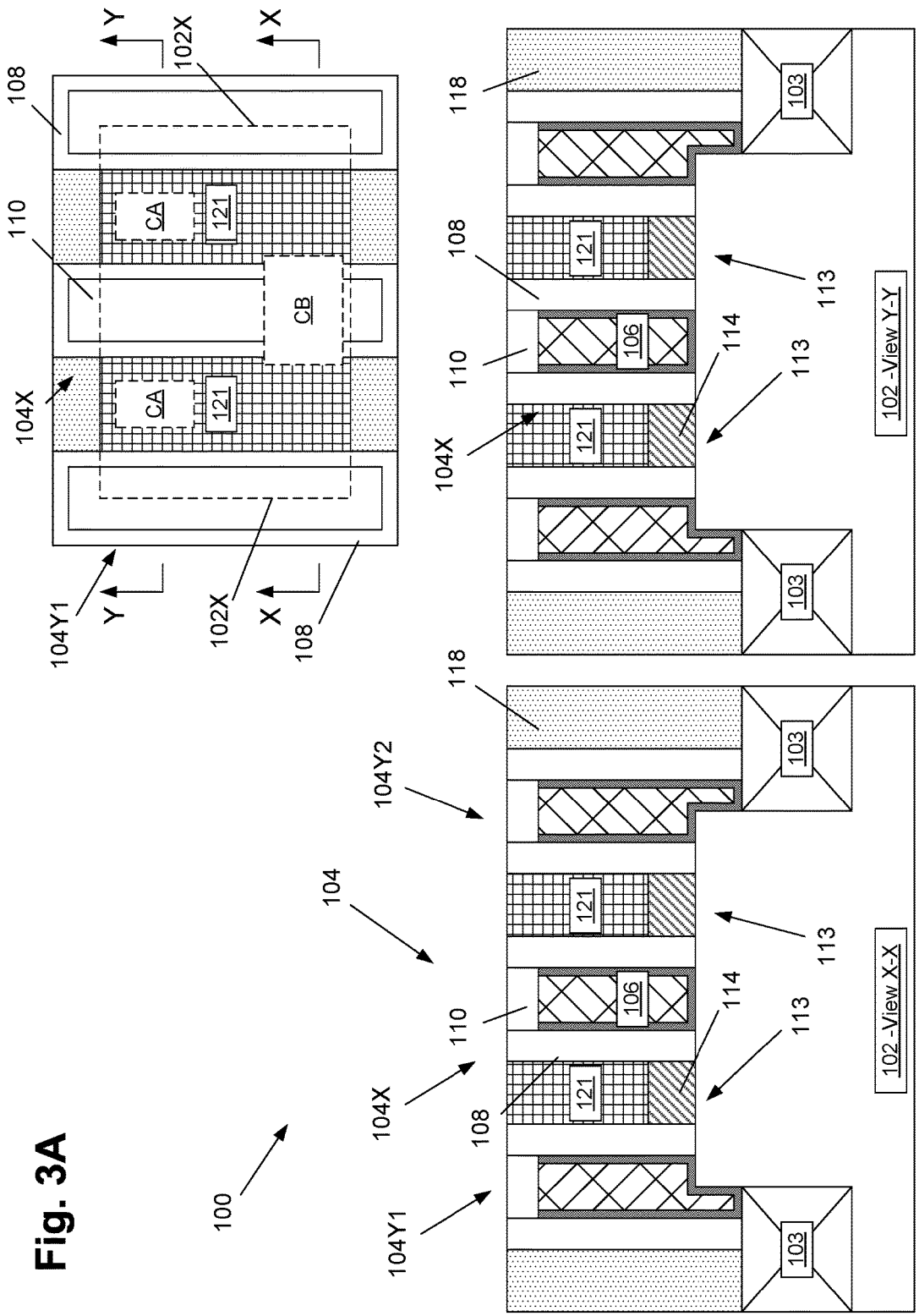
FIGS. 3A-3H depict various other methods disclosed herein for forming a gate contact above an active region of a semiconductor device.

FIGS. 3A-3H depict various other methods disclosed herein for forming a gate contact above an active region of a semiconductor device. FIG. 3A depicts the product 100 at a point in processing that corresponds to that shown in FIG. 2C, i.e., after the formation of the original conductive source/drain contact structures 121.

Figure 3B:
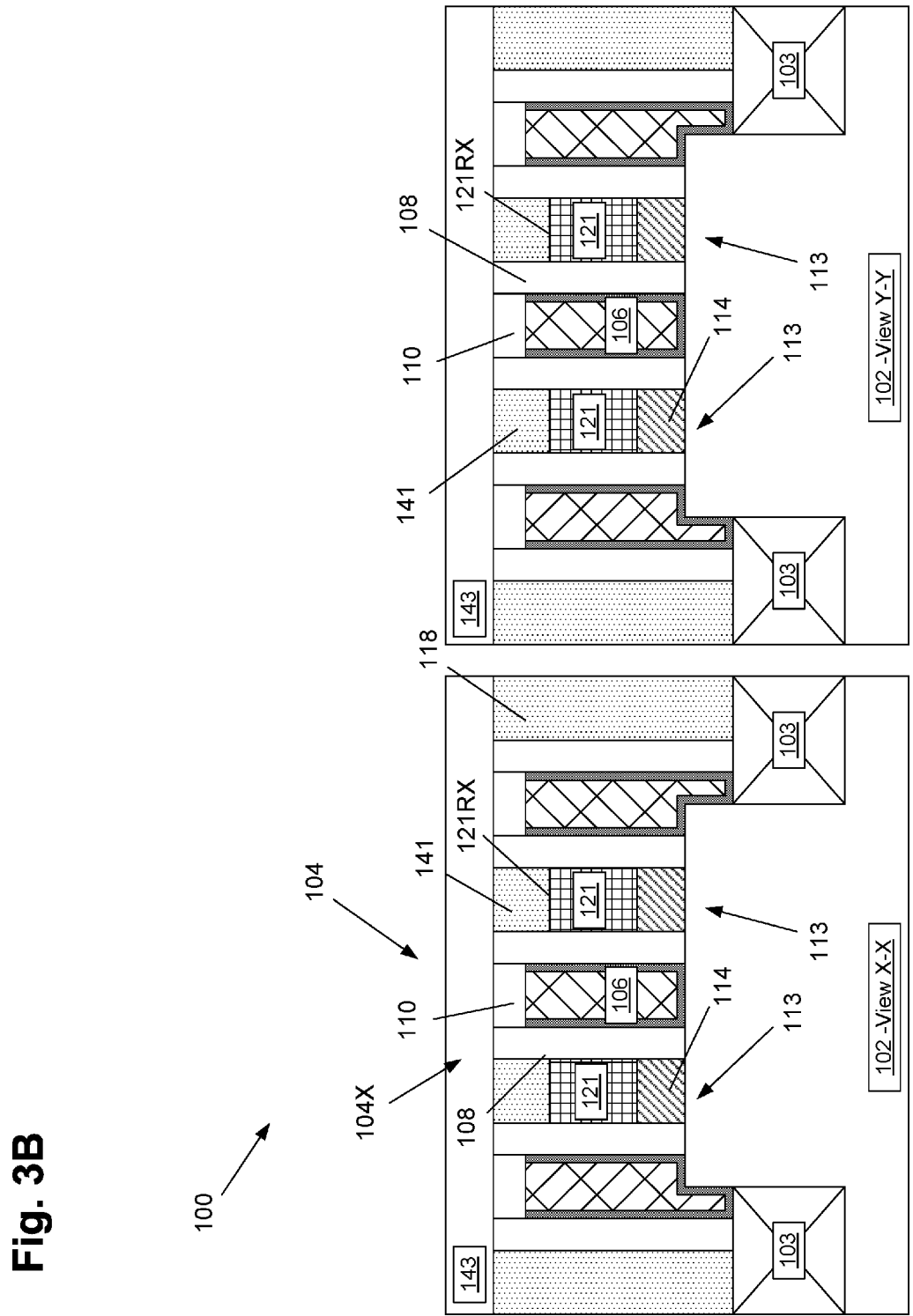

FIG. 3B depicts the product 100 after several processing operations were performed. First, one or more timed, recess etching processes were performed to reduce the overall height or thickness of the conductive source/drain contact structures 121 across the entire active region 102X. After the etching process, the entire conductive source/drain contact structures 121 have a recessed upper surface 121RX. Then, a layer of insulating material 141, e.g., silicon dioxide, SiCO, etc., was blanket-deposited across the product and above the recessed conductive source/drain contact structures 121. Next, a chemical mechanical planarization (CMP) process was performed that stopped on the gate caps 110. Thereafter, a hard mask layer 143, e.g., silicon nitride, etc., was blanket-deposited above the product 100 and a chemical mechanical planarization (CMP) process was performed to planarize its upper surface.

Figure 3C:
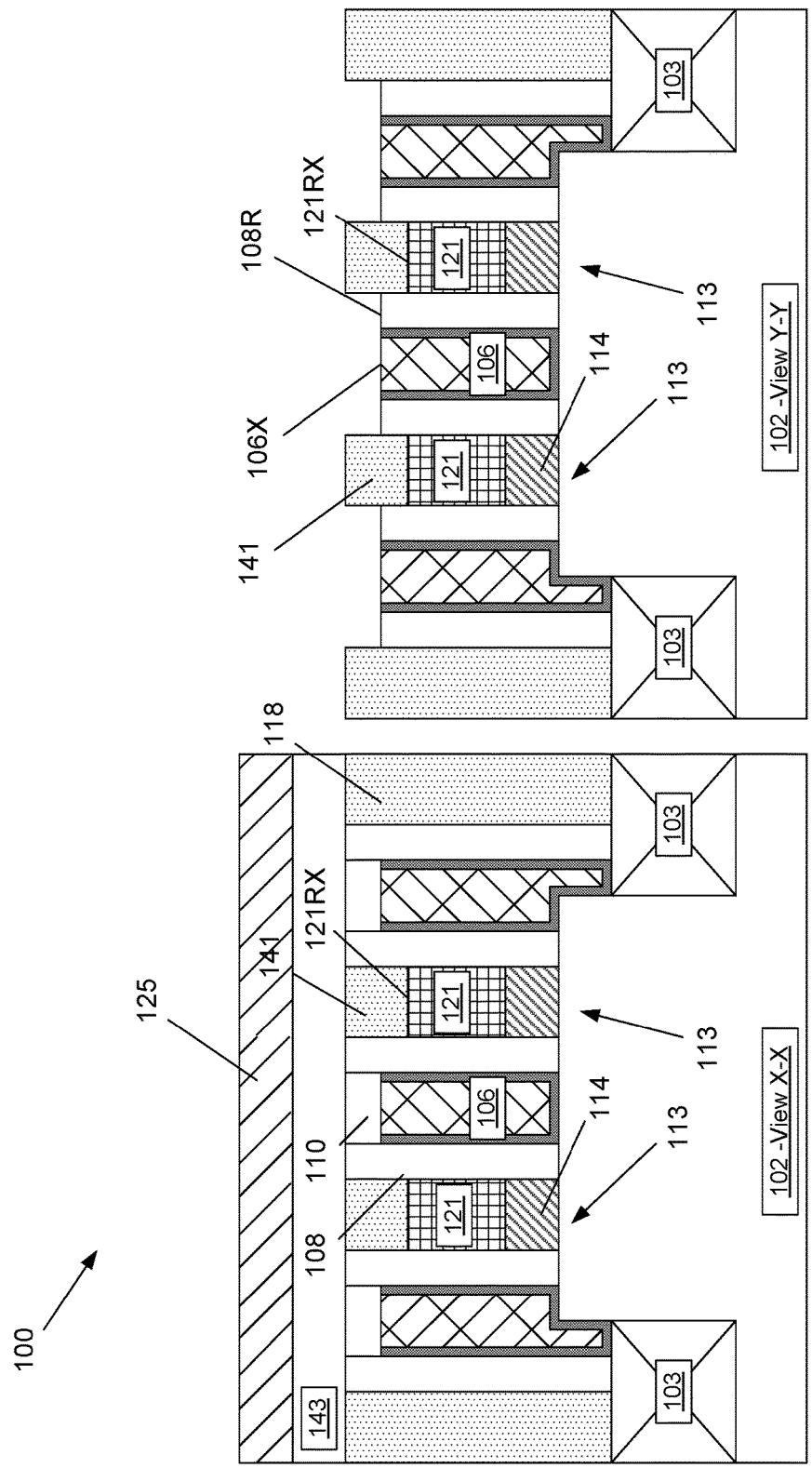

FIG. 3C depicts the product 100 after several processing operations were performed. First, the above-described patterned masking layer 125, e.g., OPL, was formed above the product 100. The patterned masking layer 125 covers the area above the active region 102X where the gate contact (CB) will be formed but exposes the area above the active region 102X where the S/D contacts (CA) will be formed. Thereafter, an etching process was performed thorough the patterned masking layer 125 so as to remove the portion of the hard mask layer 143 positioned above the active region 102X where the S/D contacts (CA) will be formed. This etching process also removes the exposed portions of the gate caps 110 and recesses the exposed portions of the sidewall spacers 108 such that they have a recessed upper surface 108R. This process operation results in the exposure of the upper surface 106X of the final gate structures 106 in the area above the active region 102X where the S/D contacts (CA) will be formed.

Figure 3D:
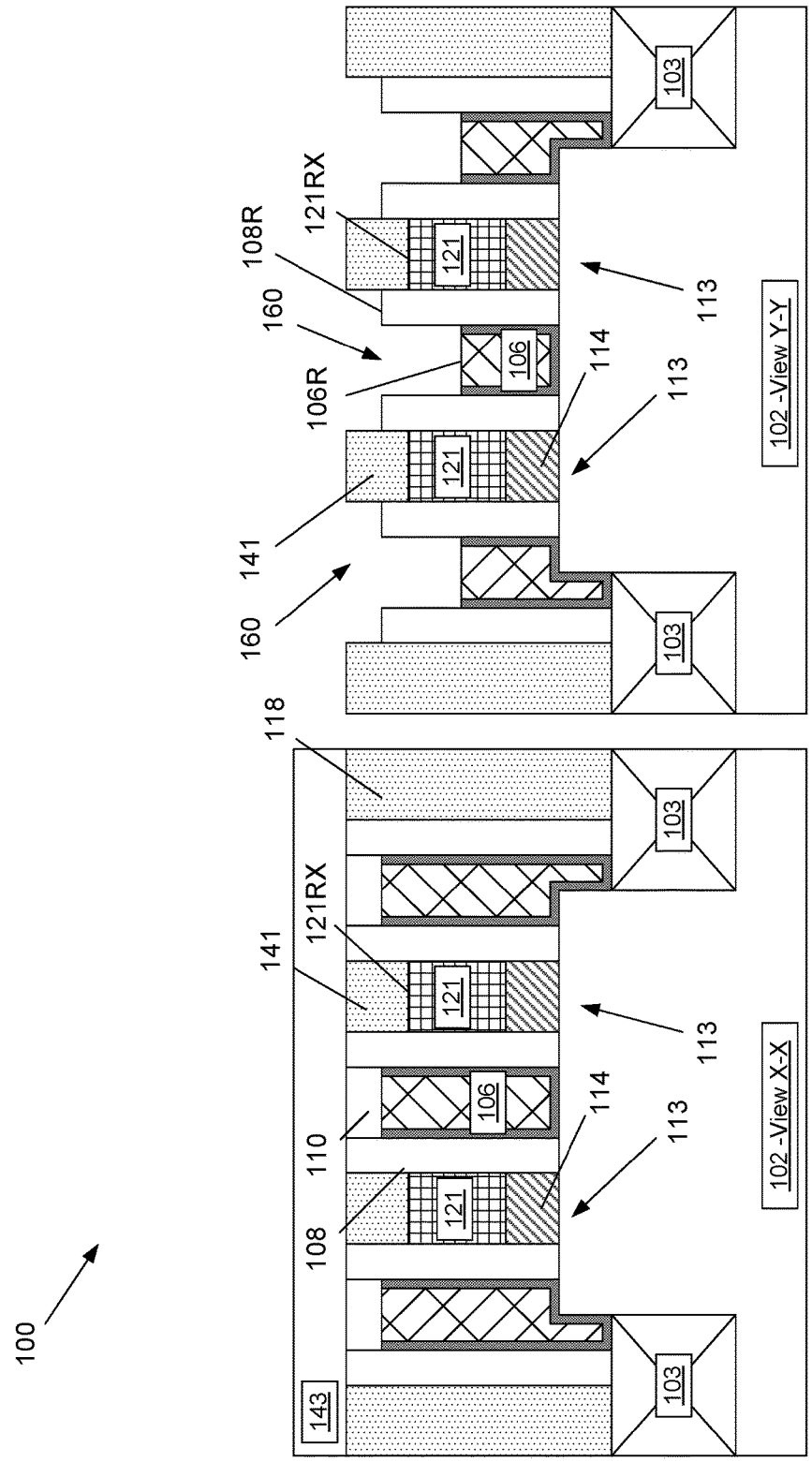

FIG. 3D depicts the product 100 after several processing operations were performed. First, the patterned masking layer 125 was removed. Thereafter, the above-described one or more timed, recess etching processes were performed to reduce the overall height or thickness of the exposed portions of the final gate structures 106. After the etching process, the exposed portions of the final gate structures 106 have a recessed upper surface 106R that is positioned at a level that is below a level of the upper surface 106X of the final gate structures 106. This results in the formation of a plurality of gate recesses 160 above the recessed materials of the final gate structures 106. Note that the portions of the final gate structures 106 positioned under the hard mask layer 143 still have their original overall height.

Figure 3E:
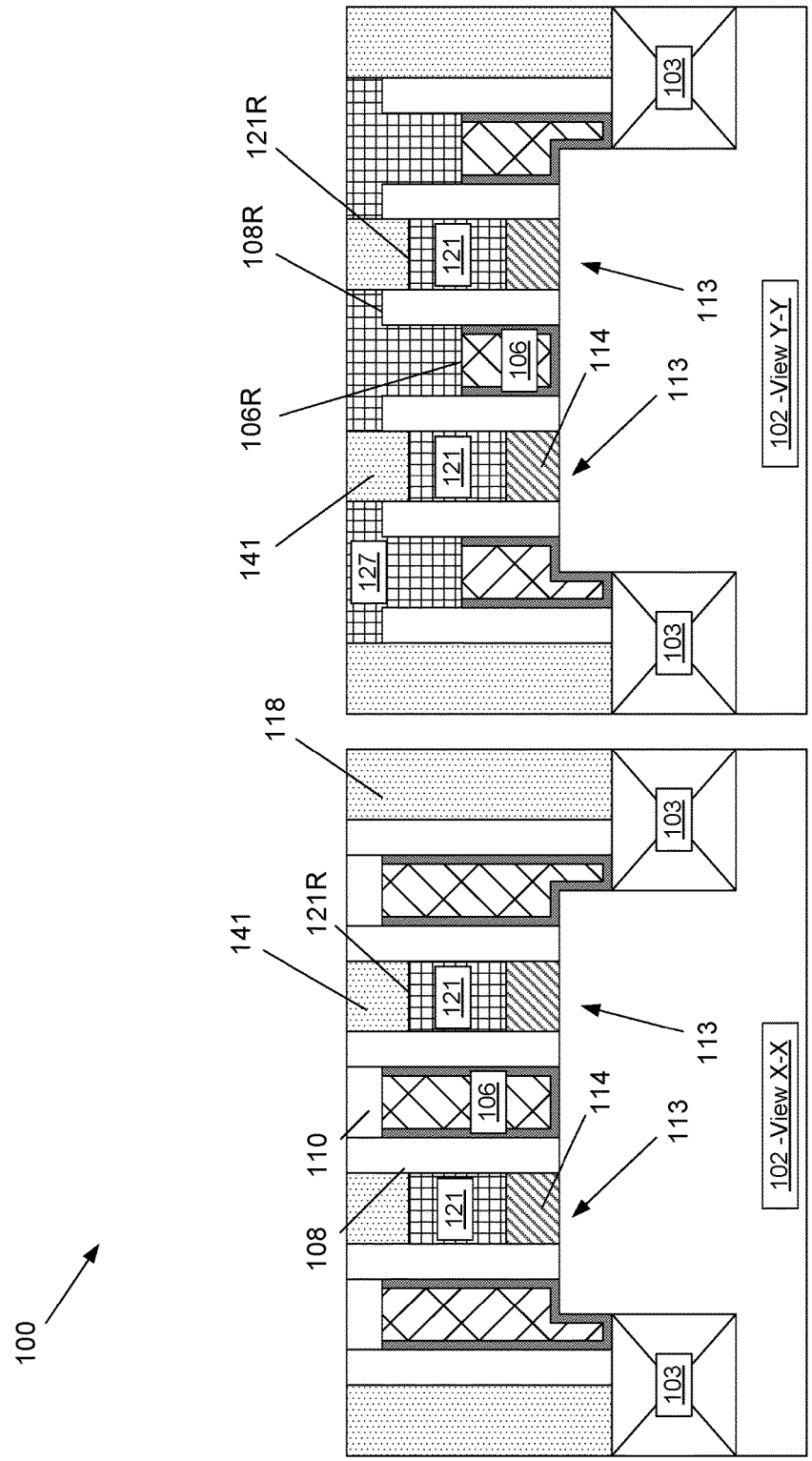

FIG. 3E depicts the product 100 after several processing operations were performed. First, the above-described layer of gate cap material 127 was blanket-deposited on the product 100 in the gate recesses 160 and above the hard mask layer 143. The layer of gate cap material 127 overfills the gate recesses 160. Thereafter, a chemical mechanical planarization (CMP) process was performed that stops on the insulating material 141/118.

Figure 3F:
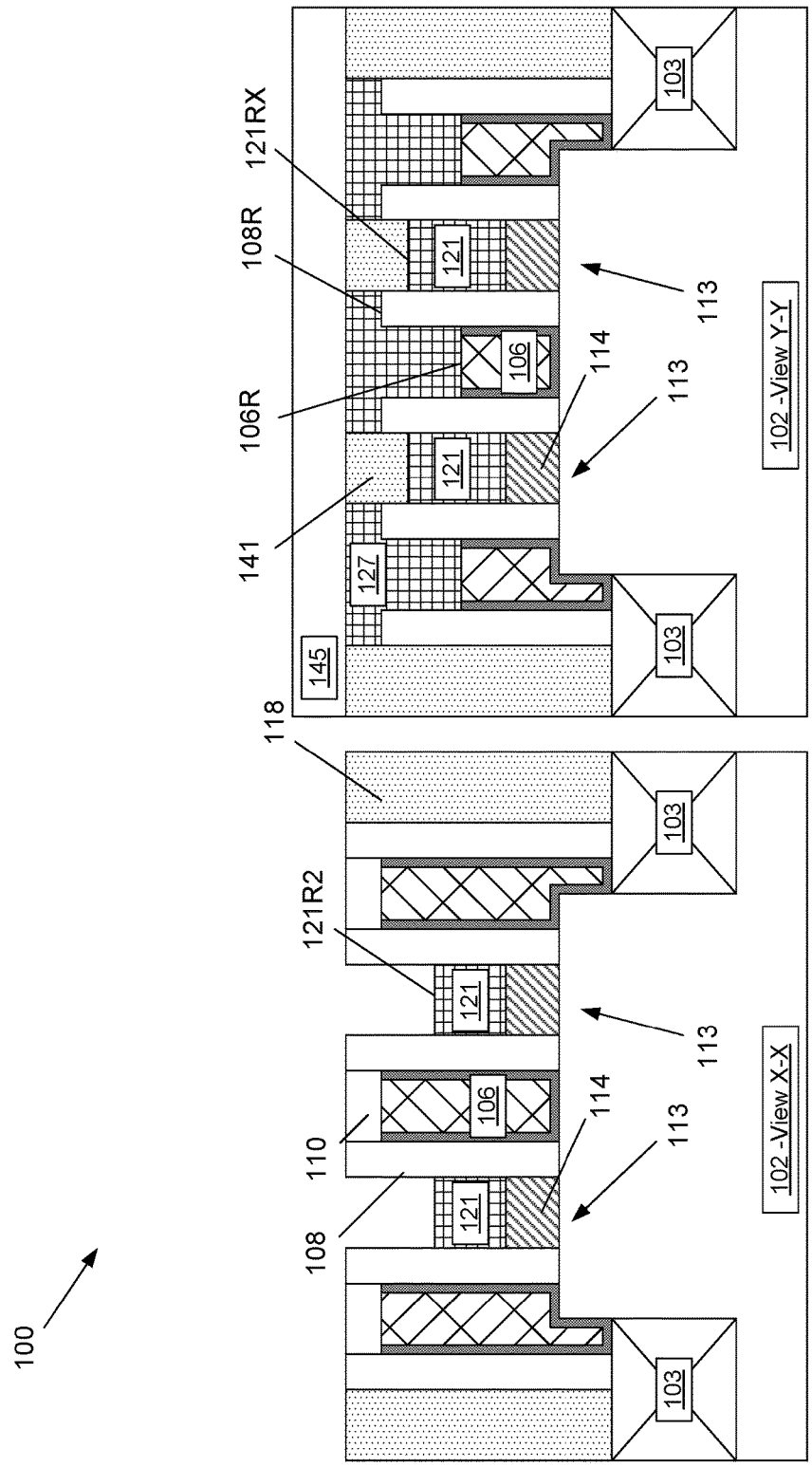

FIG. 3F depicts the product 100 after several processing operations were performed. First, a patterned layer of insulating material 145, e.g., silicon dioxide, SiCO, etc., was formed on the product 100. The patterned layer of insulating material 145 was formed by blanket-depositing the material across the product and thereafter performing an etching process through a patterned etch mask (not shown). The patterned layer of insulating material 145 covers the area above the active region 102X where the S/D contacts (CA) will be formed but exposes the area above the active region 102X where the gate contact (CB) will be formed. Then, another timed, recess etching process was performed to further reduce the overall height or thickness of the exposed portions of the conductive source/drain contact structures 121. After the etching process, the exposed portions of the conductive source/drain contact structures 121 have a further recessed upper surface 121R2.

Figure 3G:
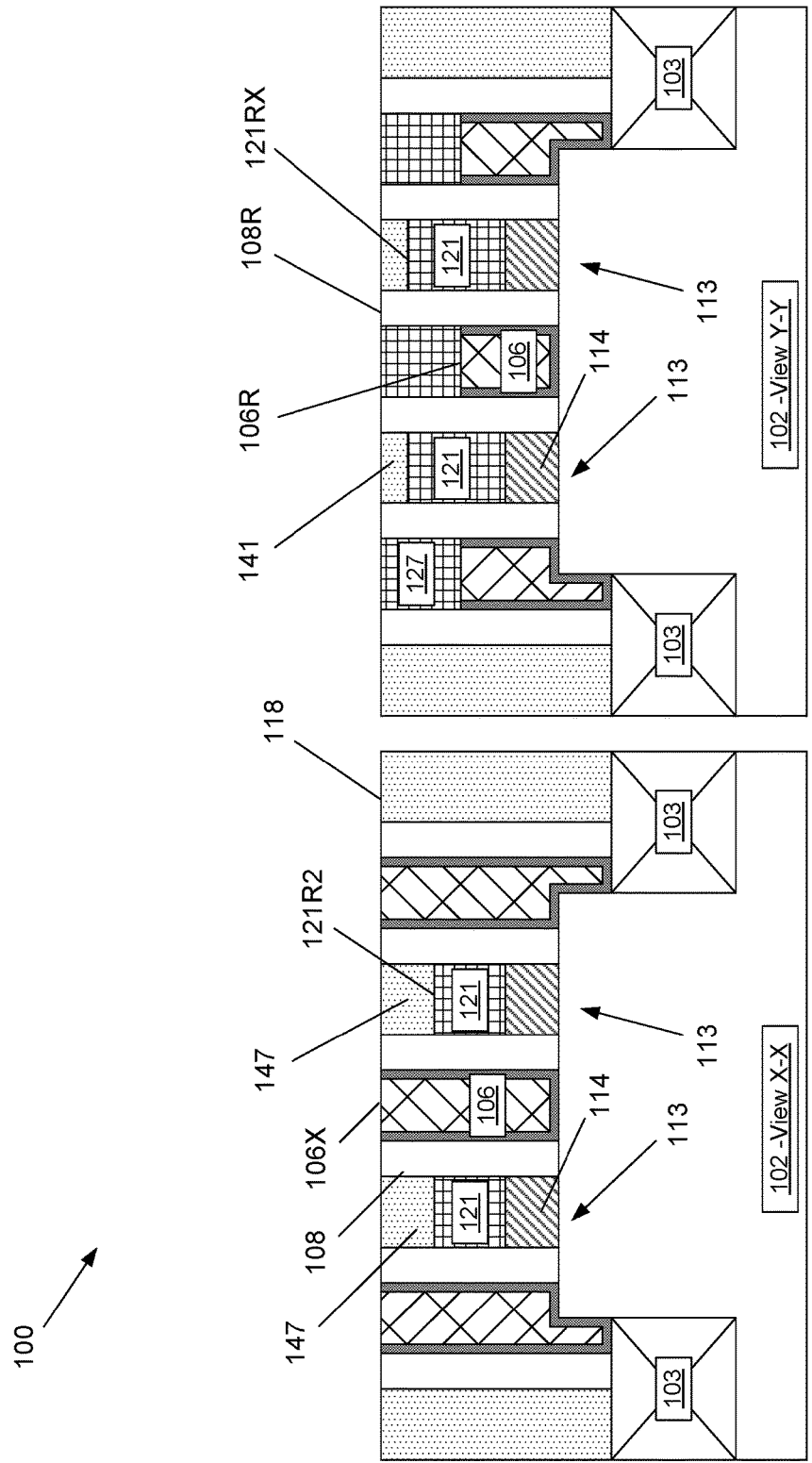

FIG. 3G depicts the product 100 after one or more chemical mechanical planarization (CMP) processes were performed to remove the patterned layer of insulating material 145 and to remove the gate caps 110. This process exposes the upper surface 106X of the final gate structures 106 in the area where the gate contact will be formed. As before, the materials of the final gate structures 106 were recessed by an amount that is greater than the initial thickness 110X of the gate caps 110. As a result, the original gate caps 110 can be removed while the recessed gate materials remained covered by the gate cap material 127 positioned in the recesses 160.

Figure 3H:
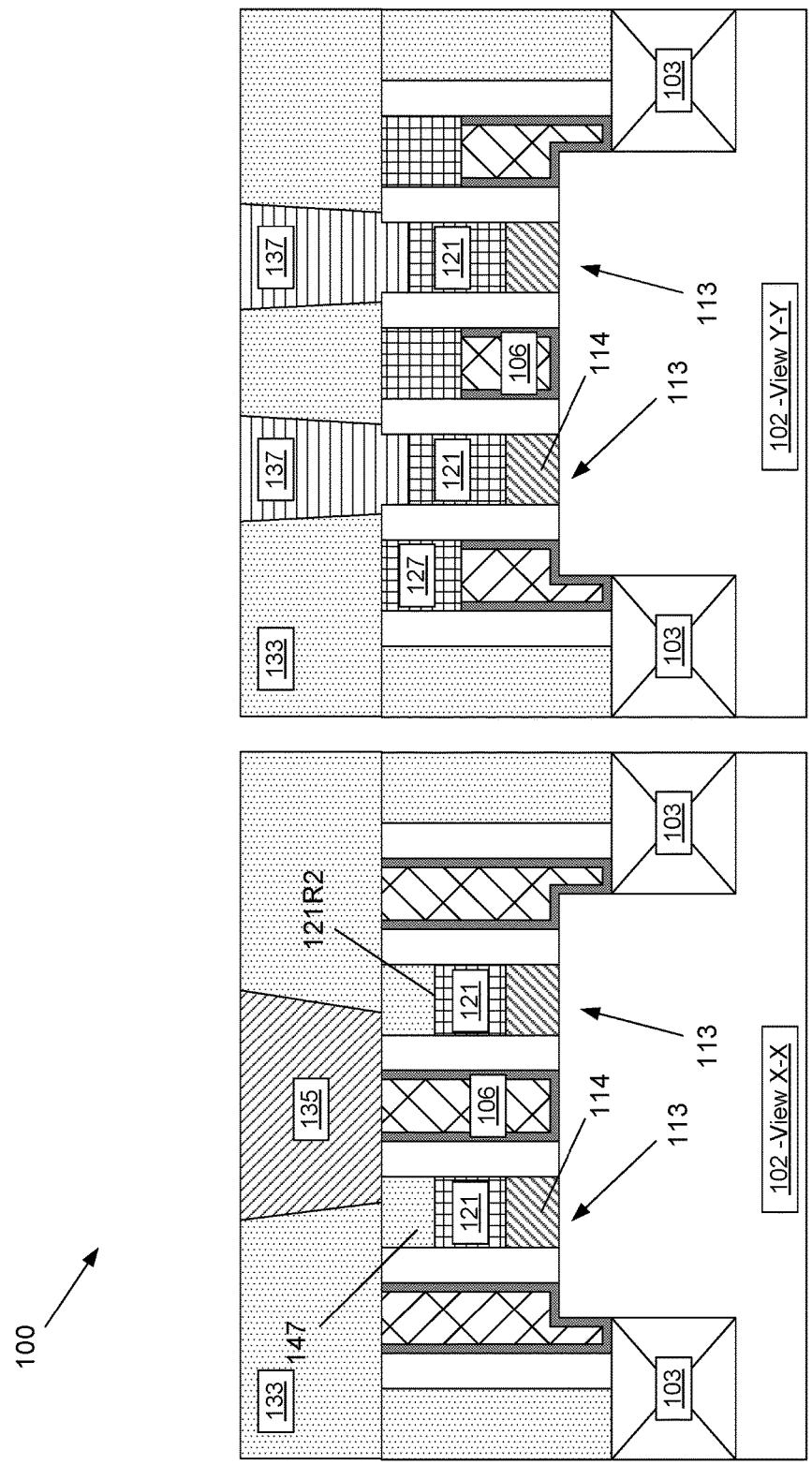

FIG. 3H depicts the product 100 after the above-described gate contact (CB) structure 135 and source/drain contact (CA) structures 137 were formed in the layer of insulating material 133 using traditional manufacturing techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A transistor device positioned above an active region of a semiconducting substrate, the device comprising:
   a stepped conductive source/drain structure with a first recess defined therein, said first recess being located vertically above a first area of said active region;
   a stepped final gate structure with a second recess defined therein, said second recess being located vertically above a second area of said active region, wherein, when viewed from above, said second recess is axially and laterally offset from said first recess, and wherein said stepped conductive source/drain structure is positioned between said stepped final gate structure and a second gate structure of said transistor device and extends from a first sidewall spacer positioned adjacent to said stepped final gate structure to a second sidewall spacer positioned adjacent to said second gate structure;
   a raised source/drain region positioned between said stepped final gate structure and said second gate structure, said raised source/drain region conductively coupling said stepped conductive source/drain structure to a source/drain region formed in said active region
   a layer of insulating material positioned above said stepped conductive source/drain structure and said stepped final gate structure;
   a conductive gate (CB) contact positioned in said layer of insulating material that is conductively coupled to an upper surface of said stepped final gate structure, wherein at least a portion of said conductive gate (CB) contact is positioned vertically above said active region; and
   a conductive source/drain (CA) contact positioned in said layer of insulating material that is conductively coupled to said upper surface of said stepped conductive source/drain structure, wherein at least a portion of said conductive source/drain (CA) contact is positioned vertically above said active region.

2. The device of claim 1, wherein an entirety of said conductive gate (CB) contact is positioned vertically above said active region.

3. The device of claim 1, wherein said stepped conductive source/drain structure has a stepped configuration when viewed in cross-sectional view taken through said stepped conductive source/drain structure in a direction corresponding to a gate width direction of said transistor device and wherein said stepped final gate structure has a stepped configuration when viewed in cross-sectional view taken through said stepped final gate structure in a direction corresponding to a gate width direction of said transistor device.

4. The device of claim 1, wherein said conductive gate (CB) contact is positioned laterally adjacent said first recess and separated therefrom by at least one non-conductive material.

5. The device of claim 1, wherein said conductive source/drain (CA) contact is positioned laterally adjacent said second recess and separated therefrom by at least one non-conductive material.

6. The device of claim 1, further comprising an insulating gate cap material positioned in said second recess.

7. The device of claim 1, further comprising an insulating material positioned in said first recess.

8. The device of claim 1, wherein said active region has an overall gate width dimension in a direction corresponding to a gate width direction of said transistor device, and wherein said first recess in said stepped conductive source/drain structure has an overall axial length in a gate width direction of said device that is approximately 20-60% of said overall gate width dimension of said active region.

9. The device of claim 1, wherein said active region has an overall gate width dimension in a direction corresponding to a gate width direction of said transistor device, and wherein said second recess in said stepped final gate structure has an overall axial length in a gate width direction of said device that is approximately 40-80% of said overall gate width dimension of said active region.

10. The device of claim 1, further comprising a silicon nitride sidewall spacer positioned between said stepped conductive source/drain structure and said stepped final gate structure and wherein said stepped conductive source/drain structure comprises a metal silicide material and a conductive metal positioned above said metal silicide material and wherein said stepped final gate structure comprises a high-k insulating material and at least one material comprising a metal.

11. The device of claim 1, wherein said second recess extends across an upper surface of said stepped final gate structure from a first inside surface of said first sidewall spacer to a second inside surface of said first sidewall spacer that is opposite of said first inside surface.

12. The device of claim 1, wherein said first recess extends across an upper surface of said stepped conductive source/drain structure from an outside surface of said first sidewall spacer to an outside surface of said second sidewall spacer.

13. A transistor device positioned above an active region of a semiconducting substrate, the transistor device comprising:
   a stepped conductive source/drain structure with a first recess defined therein, said first recess being located vertically above a first area of said active region;
   an insulating material positioned in said first recess;
   a stepped final gate structure with a second recess defined therein, said second recess being located vertically above a second area of said active region, wherein, when viewed from above, said second recess is axially and laterally offset from said first recess;
   a layer of insulating material positioned above said stepped conductive source/drain structure and said stepped final gate structure;
   a conductive gate (CB) contact positioned in said layer of insulating material that is conductively coupled to an upper surface of said stepped final gate structure, wherein at least a portion of said conductive gate (CB) contact is positioned vertically above said active region; and
   a conductive source/drain (CA) contact positioned in said layer of insulating material that is conductively coupled to said upper surface of said stepped conductive source/drain structure, wherein at least a portion of said conductive source/drain (CA) contact is positioned vertically above said active region.

14. The transistor device of claim 13, wherein said stepped conductive source/drain structure has a stepped configuration when viewed in cross-sectional view taken through said stepped conductive source/drain structure in a direction corresponding to a gate width direction of said transistor device and wherein said stepped final gate structure has a stepped configuration when viewed in cross-sectional view taken through said stepped final gate structure in a direction corresponding to a gate width direction of said transistor device.

15. The transistor device of claim 13, wherein said conductive gate (CB) contact is positioned laterally adjacent said first recess and separated therefrom by at least one non-conductive material, and wherein said conductive source/drain (CA) contact is positioned laterally adjacent said second recess and separated therefrom by at least one non-conductive material.

16. A transistor device positioned above an active region of a semiconducting substrate, the transistor device comprising:
- a stepped conductive source/drain structure with a first recess defined therein, said first recess being located vertically above a first area of said active region;
- a stepped final gate structure with a second recess defined therein, said second recess being located vertically above a second area of said active region, wherein, when viewed from above, said second recess is axially and laterally offset from said first recess;
- an insulating gate cap material positioned in said second recess;
- a layer of insulating material positioned above said stepped conductive source/drain structure and said stepped final gate structure;
- a conductive gate (CB) contact positioned in said layer of insulating material that is conductively coupled to an upper surface of said stepped final gate structure, wherein at least a portion of said conductive gate (CB) contact is positioned vertically above said active region; and
- a conductive source/drain (CA) contact positioned in said layer of insulating material that is conductively coupled to said upper surface of said stepped conductive source/drain structure, wherein at least a portion of said conductive source/drain (CA) contact is positioned vertically above said active region.

17. The transistor device of claim 16, wherein said stepped conductive source/drain structure has a stepped configuration when viewed in cross-sectional view taken through said stepped conductive source/drain structure in a direction corresponding to a gate width direction of said transistor device and wherein said stepped final gate structure has a stepped configuration when viewed in cross-sectional view taken through said stepped final gate structure in a direction corresponding to a gate width direction of said transistor device.

18. The transistor device of claim 16, further comprising an insulating material positioned in said first recess.

* * * * *